(12) United States Patent
Lee et al.

(10) Patent No.: US 10,109,617 B2
(45) Date of Patent: Oct. 23, 2018

(54) SOLID STATE DRIVE PACKAGE

(71) Applicant: SAMSUNG ELECTRONICS CO., LTD., Suwon-si (KR)

(72) Inventors: Kwang-Ryul Lee, Asan-si (KR); Boseong Kim, Songnam-si (KR); Taeduk Nam, Seoul (KR); Wangju Lee, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/652,559

(22) Filed: Jul. 18, 2017

(65) Prior Publication Data

US 2018/0026022 A1    Jan. 25, 2018

Related U.S. Application Data

(60) Provisional application No. 62/364,933, filed on Jul. 21, 2016.

(30) Foreign Application Priority Data

Oct. 6, 2016    (KR) ........................ 10-2016-0129206

(51) Int. Cl.
| | | |
|---|---|---|
| *H01L 23/552* | (2006.01) | |
| *H01L 25/18* | (2006.01) | |
| *H01L 21/56* | (2006.01) | |
| *H01L 23/31* | (2006.01) | |
| *H01L 23/538* | (2006.01) | |

(Continued)

(52) U.S. Cl.
CPC ............ *H01L 25/18* (2013.01); *H01L 21/561* (2013.01); *H01L 21/565* (2013.01); *H01L 23/3128* (2013.01); *H01L 23/5383* (2013.01); *H01L 23/5385* (2013.01); *H01L 23/5386* (2013.01); *H01L 23/552* (2013.01); *H01L 24/48* (2013.01);

(Continued)

(58) Field of Classification Search
CPC ...... H01L 25/50; H01L 25/18; H01L 25/0652; H01L 25/0655; H01L 25/105; H01L 21/561; H01L 21/565; H01L 23/3128; H01L 23/5383; H01L 23/5385; H01L 23/5386; H01L 23/552; H01L 24/48
See application file for complete search history.

(56) References Cited

U.S. PATENT DOCUMENTS

| | | |
|---|---|---|
| 6,618,267 B1 | 9/2003 | Dalal et al. |
| 8,653,654 B2 | 2/2014 | Chandra et al. |

(Continued)

FOREIGN PATENT DOCUMENTS

| | | |
|---|---|---|
| KR | 10-2014-0088764 A | 7/2014 |
| KR | 10-1537390 B1 | 7/2015 |
| KR | 10-1601388 B1 | 3/2016 |

*Primary Examiner* — Sitaramarao S Yechuri
(74) *Attorney, Agent, or Firm* — Sughrue Mion, PLLC

(57) ABSTRACT

A solid state drive package is provided. The solid state drive package may include an integrated circuit substrate including: a lower redistribution layer; a first chip and a second chip provided on the lower redistribution layer; and a connection substrate provided on the lower redistribution layer, the connection substrate provided on an outer periphery of the first chip and the second chip; and a plurality of third chips provided on the integrated circuit substrate. The plurality of third chips are electrically connected to the first chip and the second chip via the connection substrate and the lower redistribution layer.

20 Claims, 18 Drawing Sheets

(51) Int. Cl.
*H01L 25/065* (2006.01)
*H01L 25/10* (2006.01)
*H01L 23/00* (2006.01)

(52) U.S. Cl.
CPC ...... *H01L 25/0652* (2013.01); *H01L 25/0655* (2013.01); *H01L 25/105* (2013.01); *H01L 24/32* (2013.01); *H01L 24/73* (2013.01); *H01L 2224/32145* (2013.01); *H01L 2224/32225* (2013.01); *H01L 2224/48091* (2013.01); *H01L 2224/48106* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06548* (2013.01); *H01L 2225/06562* (2013.01); *H01L 2225/06565* (2013.01); *H01L 2225/107* (2013.01); *H01L 2225/1023* (2013.01); *H01L 2924/1443* (2013.01); *H01L 2924/19105* (2013.01)

(56) References Cited

U.S. PATENT DOCUMENTS

| | | | |
|---|---|---|---|
| 8,941,222 B2 | 1/2015 | Hunt | |
| 9,035,461 B2 | 5/2015 | Hu et al. | |
| 9,236,355 B2 | 1/2016 | Zhai et al. | |
| 9,373,527 B2 | 6/2016 | Yu et al. | |
| 2005/0161823 A1* | 7/2005 | Jobetto | H01L 21/4857 257/758 |
| 2008/0088018 A1* | 4/2008 | Yoon | H01L 23/3114 257/738 |
| 2009/0218670 A1* | 9/2009 | Yamamoto | H01L 23/49838 257/686 |
| 2010/0224992 A1* | 9/2010 | McConnelee | H01L 23/5383 257/723 |
| 2011/0140283 A1 | 6/2011 | Chandra et al. | |
| 2012/0119373 A1 | 5/2012 | Hunt | |
| 2012/0228754 A1* | 9/2012 | Liu | H01L 23/13 257/676 |
| 2014/0057394 A1 | 2/2014 | Ramasamy et al. | |
| 2014/0104953 A1* | 4/2014 | Itakura | G11C 16/30 365/185.18 |
| 2014/0210099 A1 | 7/2014 | Hu et al. | |
| 2014/0252640 A1* | 9/2014 | Kwak | H01L 25/0652 257/773 |
| 2015/0115464 A1 | 4/2015 | Yu et al. | |
| 2015/0155203 A1 | 6/2015 | Chen et al. | |
| 2015/0303149 A1 | 10/2015 | Zhai et al. | |
| 2016/0013172 A1 | 1/2016 | Lin et al. | |

* cited by examiner

SOLID STATE DRIVE PACKAGE

CROSS-REFERENCE TO RELATED APPLICATIONS

This U.S. non-provisional patent application claims priority from U.S. Provisional Patent Application No. 62/364,933, filed on Jul. 21, 2016, and Korean Patent Application No. 10-2016-0129206, filed on Oct. 6, 2016, the contents of which are hereby incorporated by reference in their entireties.

BACKGROUND

Apparatuses consistent with example embodiments relate to a semiconductor device, and in particular, to a solid state drive package with a reduced size.

With the advent of an information-oriented society, an amount of data to be stored or transmitted for personal use is being exponentially increased. Owing to an increase in demand for such information storage media, a variety of personal external storage devices are being developed. The external storage device is provided in the form of a single storage device and is connected to a host device. Data are read from or written to the external storage device, in accordance with commands from the host device.

Recently, hard disk drives (HDDs) are being replaced with a memory device with a non-volatile semiconductor chip (e.g., a solid state drive (SSD)). A size of the solid state drive is being decreased. Furthermore, it is necessary to reduce the time and cost required to develop a solid state drive.

SUMMARY

Example embodiments of the inventive concept provide a solid state drive package with a reduced size.

According to an aspect of an example embodiment of the inventive concept, a solid state drive (SSD) package may include an integrated circuit substrate and a plurality of first memory chips provided on the integrated circuit substrate. The integrated circuit substrate may include a lower redistribution layer, a controller chip and a second memory chip provided on the lower redistribution layer, and a connection substrate provided around the controller chip and the second memory chip and connected to the lower redistribution layer. The first memory chips may be electrically connected to the controller chip and the second memory chip via the connection substrate and the lower redistribution layer.

According to an aspect of an example embodiment of the inventive concept, a solid state drive (SSD) package may include an integrated circuit substrate and a plurality of first memory chips provided on the integrated circuit substrate. The integrated circuit substrate may include a connection substrate with a cavity, a controller chip and a second memory chip provided in the cavity of the connection substrate, a lower redistribution layer covering bottom surfaces of the connection substrate, the controller chip, and the second memory chip, and an upper redistribution layer covering top surfaces of the connection substrate, the controller chip, and the second memory chip. The first memory chips may be electrically connected to the controller chip and the second memory chip via the upper and lower redistribution layers and the connection substrate.

According to an aspect of an example embodiment of the inventive concept, a solid state drive (SSD) package may include an integrated circuit substrate including: a lower redistribution layer; a first chip and a second chip, the first and the second chips being provided on the lower redistribution layer; and a connection substrate provided on the lower redistribution layer, the connection substrate provided on an outer periphery of the first chip and the second chip; and a plurality of third chips provided on the integrated circuit substrate. The plurality of third chips are electrically connected to the first chip and the second chip via the connection substrate and the lower redistribution layer.

According to an aspect of an example embodiment of the inventive concept, a solid state drive (SSD) package may include an integrated circuit substrate including: a connection substrate with a cavity; a first chip and a second chip, the first and the second chips being provided in the cavity of the connection substrate; a lower redistribution layer covering a first surface of the connection substrate, a first surface of the first chip, and a first surface of the second chip; and an upper redistribution layer covering a second surface opposite to the first of the connection substrate, a second surface opposite to the first surface of the first chip, and a second surface opposite to the first surface of the second chip; and a plurality of third chips provided on the integrated circuit substrate. The plurality of third chips are electrically connected to the first chip and the second chip via the upper and lower redistribution layers and the connection substrate.

According to an aspect of an example embodiment of the inventive concept, a solid state drive (SSD) package may include an integrated circuit substrate including: a first redistribution layer; a first chip and a second chip provided on the lower redistribution layer; and a connection substrate provided on the lower redistribution layer, the connection substrate provided on an outer periphery of the first chip and the second chip; an upper package provided on the integrated circuit substrate and including: a package substrate; and a plurality of third chips stacked on the package substrate; and a connection layer provided between the integrated circuit substrate and the upper package. The connection layer may include at least one of a second redistribution layer and a connection terminal layer. The plurality of third chips are electrically connected to the first chip via the connection substrate and the first redistribution layer

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that the above figures are intended to illustrate the general characteristics of methods, structure and/or materials utilized in certain example embodiments and to supplement the written description provided below.

These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Hereinafter, a solid state drive package according to example embodiments of the inventive concept will be described with reference to FIGS. 1 to 13.

Figure 1:
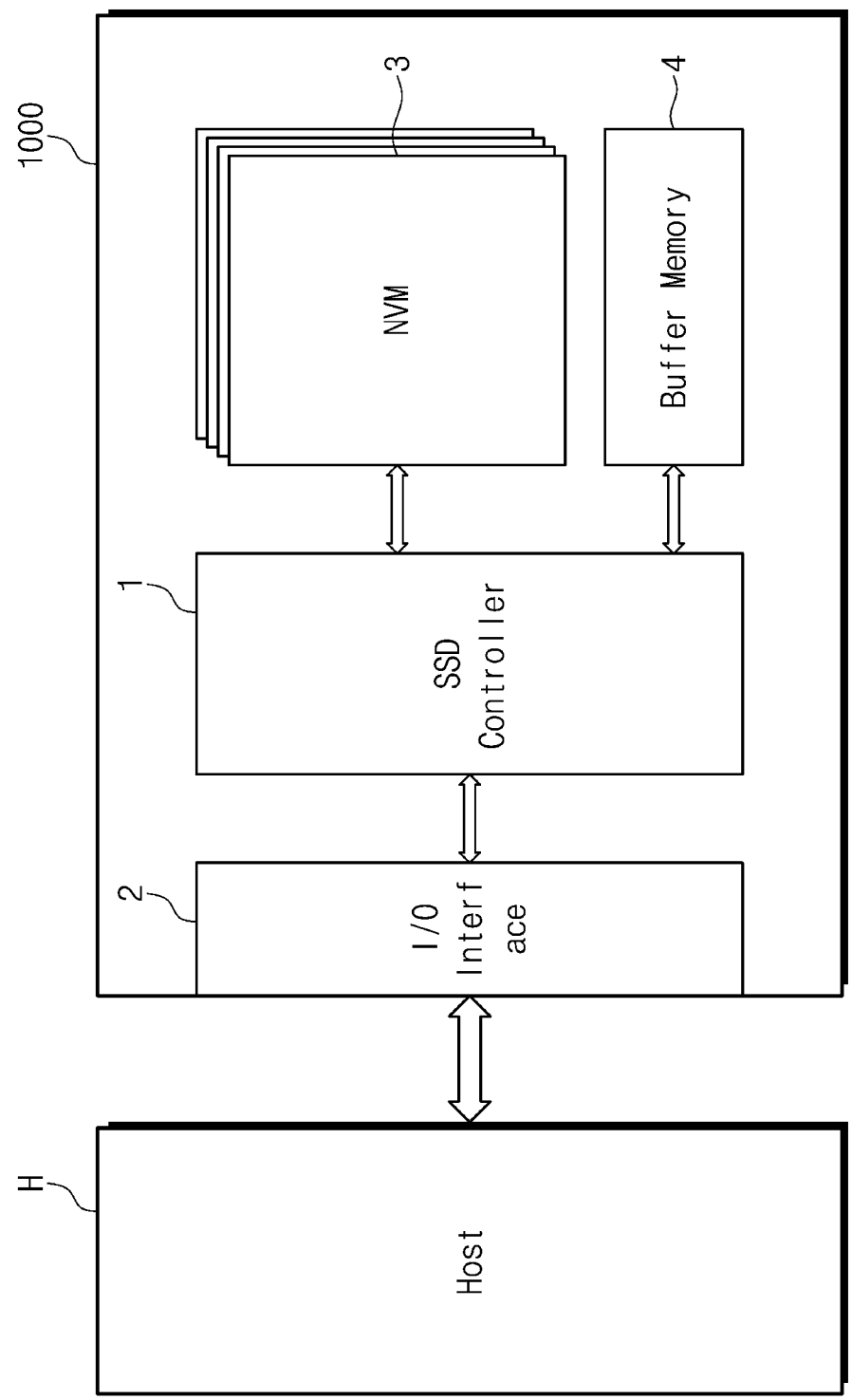
FIG. 1 is a block diagram schematically illustrating a solid state drive package according to an example embodiment of the inventive concept.

FIG. 1 is a block diagram schematically illustrating a solid state drive (SDD) package according to an example embodiment of the inventive concept.

Referring to FIG. 1, a solid state drive (SSD) package 1000 may be configured to store or read data in response to a read/write request from a host H (e.g., an external electronic device). The SSD package 1000 may include an SSD controller 1, an input/output interface 2, a plurality of non-volatile memory devices 3, and a buffer memory device 4.

The SSD controller 1 may exchange signals with the host H through the input/output interface 2. Here, the signals to be exchanged between the SSD controller 1 and the host H may include commands, address, and data. The SSD controller 1 may read or write data from or to at least one of the non-volatile memory devices 3, in response to commands from the host H.

The input/output interface 2 may be configured to provide a physical connection between the host H and the SSD package 1000. That is, the input/output interface 2 may be configured to allow the solid state drive package 1000 to interface with the host H corresponding to a bus format of the host H. The bus format of the host H may include universal serial bus (USB), PCI express, serial advanced technology attachment (SATA), parallel ATA (PATA), and so forth.

The non-volatile memory devices 3 may be NAND-type FLASH memory devices having a large capacity and a high storing speed property. In certain example embodiments, the non-volatile memory devices 3 may be phase-change random access memory (PRAM), magnetic RAM (MRAM), resistive RAM (ReRAM), ferromagnetic RAM (FRAM), or NOR FLASH memory devices.

The buffer memory device 4 may be used to temporarily store data to be transmitted between the SSD controller 1 and the non-volatile memory devices 3 and to temporarily store data to be transmitted between the SSD controller 1 and the host H. Also, the buffer memory device 4 may be used to operate software (S/W) for efficiently managing the non-volatile memory device 3. The buffer memory device 4 may include a random access memory (e.g., DRAM or SRAM). Alternatively, the buffer memory device 4 may include a non-volatile memory (e.g., FLASH memory, PRAM, MRAM, ReRAM, and FRAM).

FIGS. 2 to 12 are sectional views illustrating a solid state drive package 1000 according to example embodiments of the inventive concept. FIG. 13 is a perspective view of a SSD package 1000 according to an example embodiment of the inventive concept.

Figure 2:
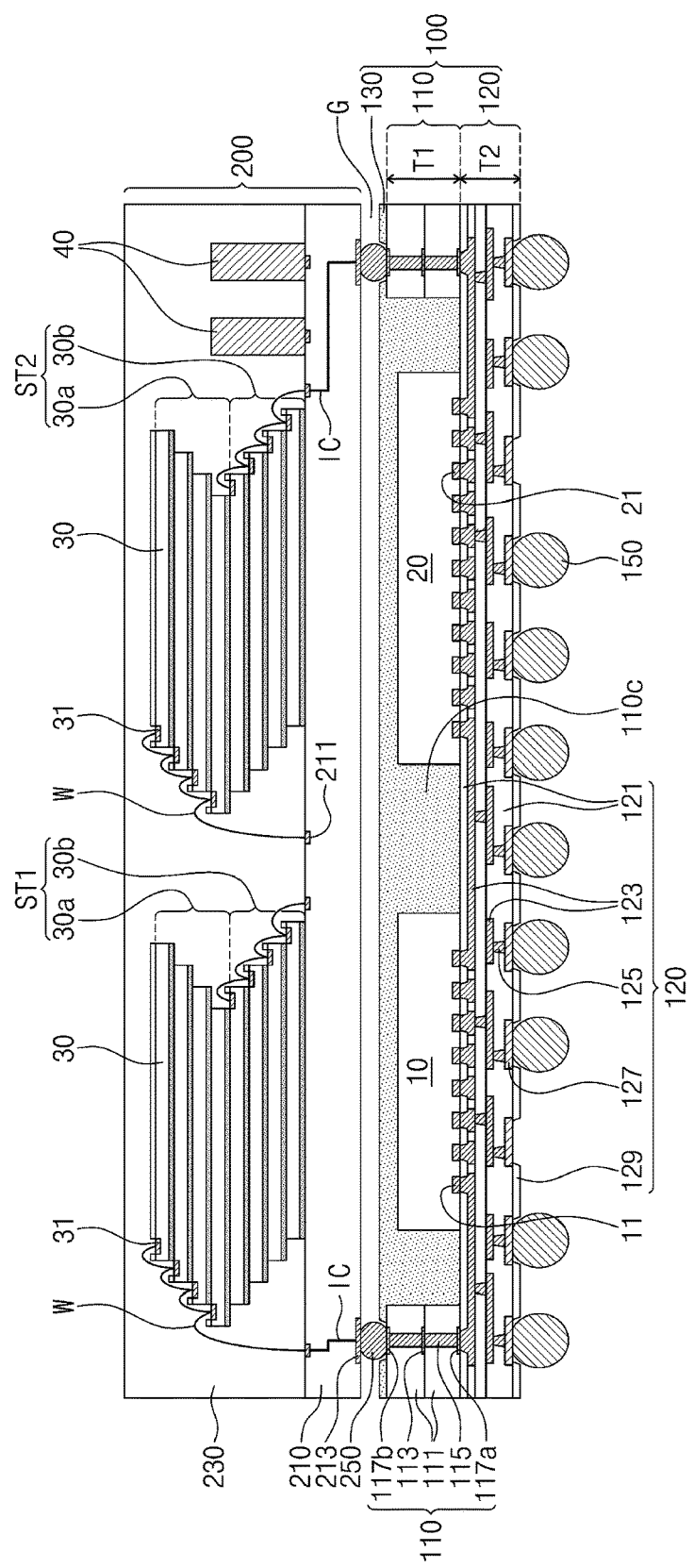
FIGS. 2 to 12 are sectional views illustrating a solid state drive package according to example embodiments of the inventive concept.

Referring to FIGS. 2 and 13, the SSD package 1000 may include an integrated circuit substrate 100 and an upper package 200 mounted on the integrated circuit substrate 100.

In the example embodiments, the integrated circuit substrate 100 may include a connection substrate 110, a buffer memory chip 10, a controller chip 20, a lower redistribution layer 120, and a lower mold layer 130.

In detail, the connection substrate 110 may include a plurality of insulating layers 111, interconnection patterns 113, conductive vias 115, and lower and upper pads 117a and 117b. As an example, the connection substrate 110 may be a printed circuit board (PCB). However, the example embodiment is not limited thereto. The lower and upper pads 117a and 117b may be disposed on bottom and top surfaces, respectively, of the connection substrate 110, and the interconnection patterns 113 may be interposed between the insulating layers 111 and may be coupled to the conductive vias 115. The lower pad 117a and the upper pad 117b may be electrically connected to each other through the conductive vias 115 and the interconnection patterns 113. In the example embodiments, the connection substrate 110 may have a cavity 110c that is positioned at a center region of the integrated circuit substrate 100. That is, the connection substrate 110 may be provided around the buffer memory chip 10 and the controller chip 20. For example, the conductive vias 115 of the connection substrate 110 may be provided at a side of the buffer memory chip 10 and at a side of the controller chip 20.

The buffer memory chip 10 and the controller chip 20 may be provided in the cavity 110c of the connection substrate 110. In an example, the buffer memory chip 10 and the controller chip 20 may be provided to be spaced apart from each other in the cavity 110c of the connection substrate 110. However, the example embodiment is not limited thereto.

Figure 3:
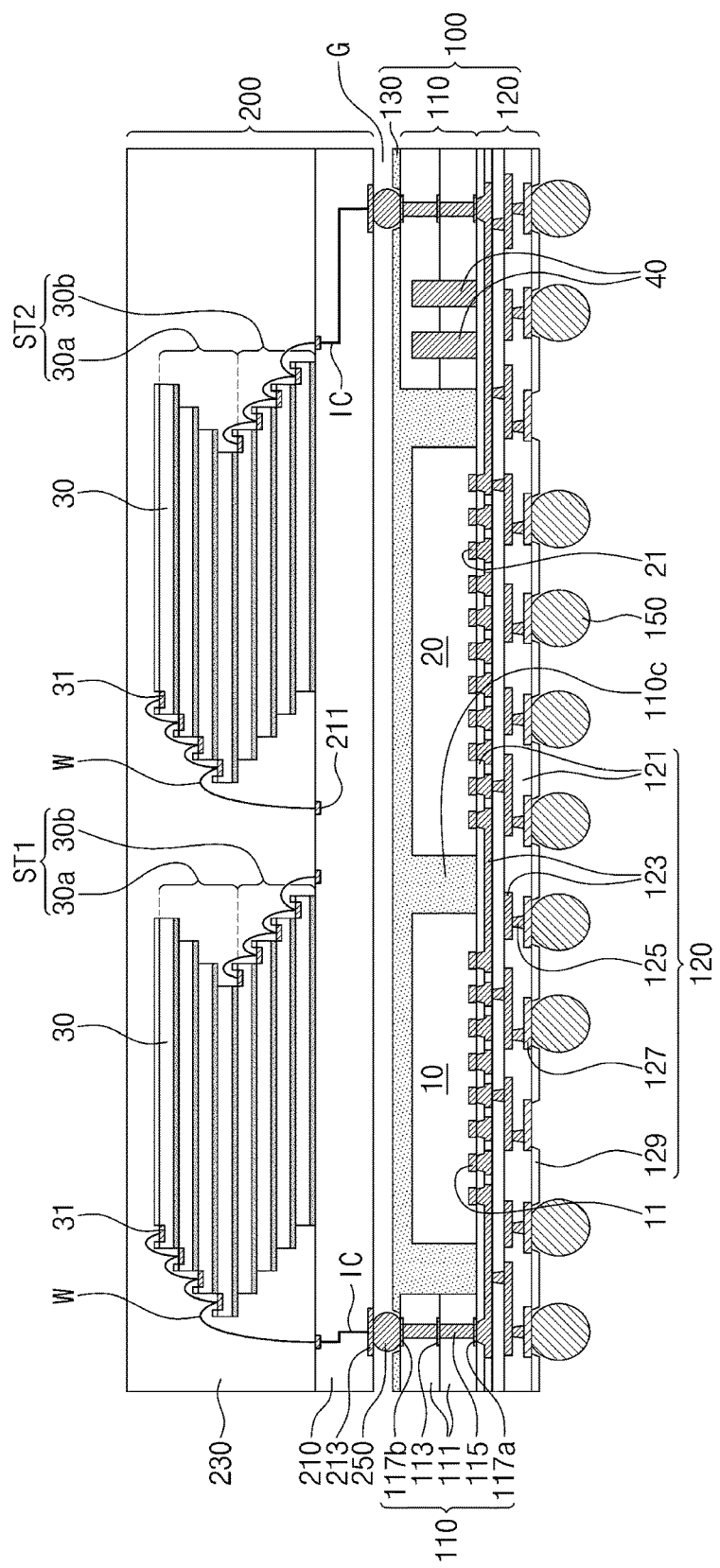
Figure 4:
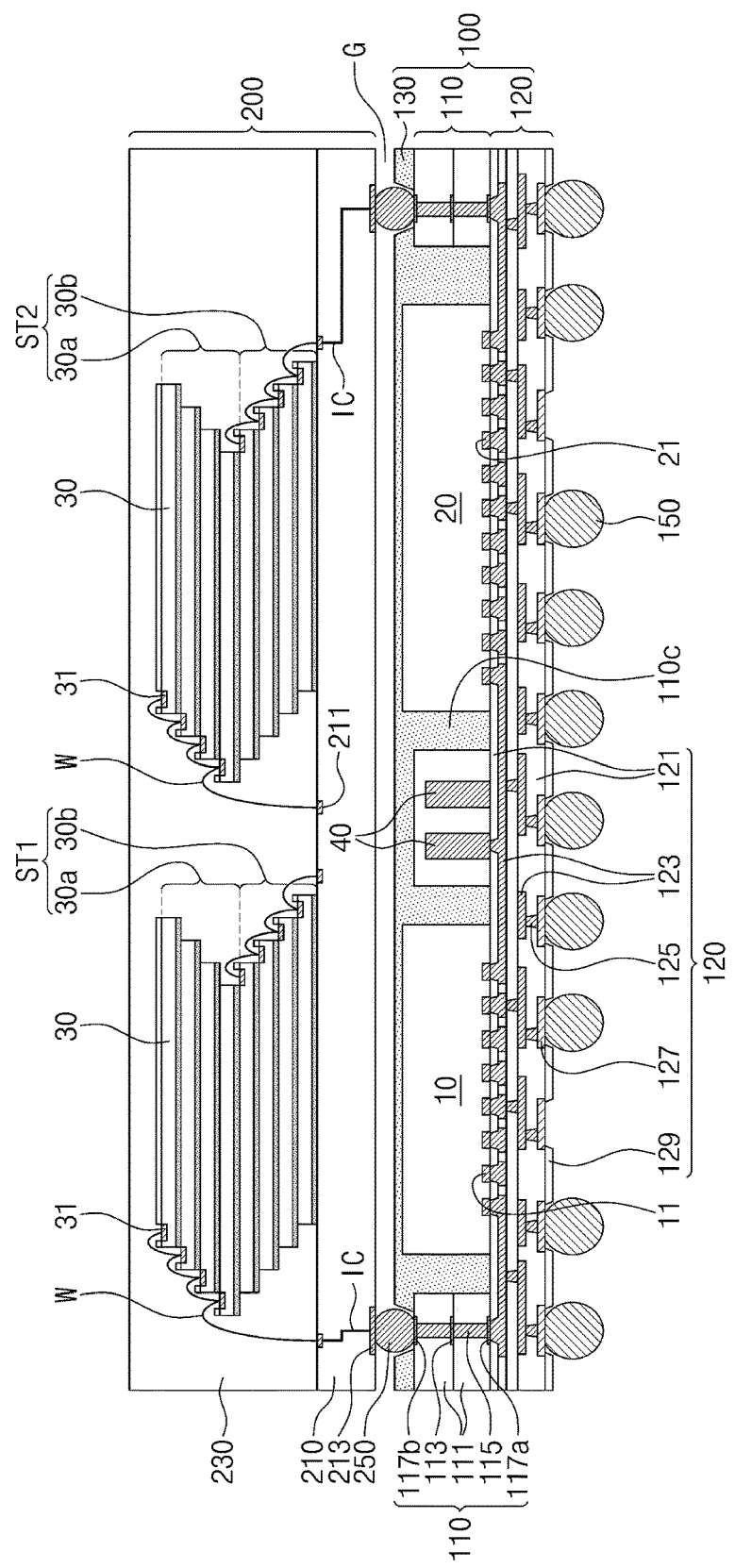

In some example embodiments, the buffer memory chip 10 and the controller chip 20 may include chip pads 11 and 21 that are respectively provided on bottom surfaces thereof. The buffer memory chip 10 and the controller chip 20 may have thicknesses that are substantially equal to or smaller than a thickness of the connection substrate 110. As an example, the buffer memory chip 10 and the controller chip 20 may have top surfaces that are positioned at substantially the same level as or at a level lower, as shown in FIG. 3, than a top surface of the connection substrate 110. In certain example embodiments, as shown in FIG. 4, the top surfaces of the buffer memory chip 10 and the controller chip 20 may be positioned at a level higher than the top surface of the connection substrate 110.

The buffer memory chip 10 may be or include a volatile memory chip (e.g., a dynamic random access memory (DRAM) chip). In certain example embodiments, the buffer memory chip 10 may be or include a PRAM chip, a ReRAM chip, a FeRAM chip, or a MRAM chip.

In some example embodiments, the controller chip 20 may include a central processing unit (CPU), an internal memory, a buffer memory control unit, a host interface, and a FLASH interface.

The controller chip 20 may include a program, which is used to exchange signals with an external device via SATA, PATA, or small computer system interface (SCSI) standard. Here, the SATA standard may include all SATA-based standards including SATA-1, SATA-2, SATA-3, and external SATA (e-SATA). The PATA standard may include all IDE-based standards including integrated drive electronics (IDE) and enhanced-IDE (E-IDE).

The lower redistribution layer 120 may be provided on bottom surfaces of the buffer memory chip 10, the controller chip 20, and the connection substrate 110. The lower redistribution layer 120 may be electrically connected to the buffer memory chip 10, the controller chip 20, and the connection substrate 110.

In some example embodiments, the connection substrate 110 may have a first thickness T1, and the lower redistribution layer 120 may have a second thickness T2 that is smaller than the first thickness T1. In an example, the second thickness T2 of the lower redistribution layer 120 may be less than a thickness of the buffer memory chip 10 or the controller chip 20.

In detail, the lower redistribution layer 120 may include a plurality of lower insulating layers 121, lower redistribution patterns 123, lower redistribution vias 125, and outer connection pads 127.

The lower redistribution patterns 123 may be provided between the lower insulating layers 121, and the lower redistribution vias 125 may be provided to electrically connect the lower redistribution patterns 123 at different levels. A number of the lower redistribution vias 125 may be electrically connected to the chip pads 11 and 21, which are respectively provided in the buffer memory chip 10 and the controller chip 20, and to the lower redistribution patterns 123 via the lower insulating layers 121. The lower redistribution patterns 123 may include signal lines, which are used to apply electrical signals, and power lines, which are used to apply a ground or power voltage.

The outer connection pads 127 may be provided on the lower insulating layer 121, and a lower protection layer 129 may be provided on the lower insulating layer 121 to expose the outer connection pads 127. The lower protection layer 129 may be formed of an insulating material different from the lower insulating layers 121. For example, the lower protection layer 129 may be formed of the same material as the lower mold layer 130. Outer connection terminals 150 (e.g., solder balls or solder bumps) may be attached to the outer connection pads 127. For example, the outer connection terminals 150 may be a ball grid array (BGA) that is provided on a bottom surface of the lower redistribution layer 120. The outer connection terminals 150 may be electrically connected to the connection substrate 110, the buffer memory chip 10, and the controller chip 20 via the lower redistribution layer 120. Accordingly, the SSD package 1000 may be directly connected to an external electronic device through the BGA. The outer connection pads 127 may include data pads for sending or receiving data signals, command/address pads for sending or receiving command/address signals, power pads for sending or receiving a ground or power voltage, and test pads, which are used to test the SSD package 1000.

In some example embodiments, as shown in FIG. 13 as an example, a number of the outer connection pads 127 may not be attached to the outer connection terminals 150 and may be exposed to the air. The outer connection pads 127, to which the outer connection terminals 150 are not attached, may be used as test pads for electrically testing the SSD package 1000.

In some example embodiments, the lower redistribution patterns 123 and the lower redistribution vias 125 may be configured to electrically connect the buffer memory chip 10 to the controller chip 20. Furthermore, the lower redistribution patterns 123 and the lower redistribution vias 125 may be used to electrically connect the connection substrate 110 to the buffer memory chip 10 or the controller chip 20. The buffer memory chip 10 and the controller chip 20 may be electrically connected to the outer connection pads 127 through the lower redistribution patterns 123 and the lower redistribution vias 125.

The lower mold layer 130 may be provided to cover top surfaces of the buffer memory chip 10, the controller chip 20, and the connection substrate 110 and to fill the cavity 110c of the connection substrate 110. The lower mold layer 130 may include an insulating polymer (e.g., an epoxy molding compound).

In an example, the lower mold layer 130 may be filled into the cavity 113c in way that the lower mold layer 130 exposes the upper pad 117b of the connection substrate 110. A connection terminal 250 may be attached to the upper pad 117b exposed by the lower mold layer 130 as shown in FIGS. 2-6, for example.

In some example embodiments, the upper package 200 may include a package substrate 210 and a plurality of non-volatile memory chips 30, passive devices 40, and an upper mold layer 230 that are mounted on the package substrate 210.

The package substrate 210 may be or include various kinds of substrates (e.g., a printed circuit board, a flexible substrate, or a tape substrate). In some example embodiments, the package substrate 210 may be a printed circuit board, in which internal wires IC are formed. The package substrate 210 may include bonding pads 211, which are provided on a top surface thereof, and coupling pads 213, which are provided on a bottom surface thereof. The bonding pads 211 may be electrically connected to the coupling pads 213 through the internal wires IC. The bonding pads 211 may be electrically connected to input/output pads 31 of the non-volatile memory chips 30 via metal wires W and may be attached to the connection terminals 250 (e.g., solder balls or solder bumps) through the coupling pads 213.

In some example embodiments, first and second chip stacks ST1 and ST2 and the passive devices 40 may be mounted on the package substrate 210.

Each of the first and second chip stacks ST1 and ST2 may include the plurality of non-volatile memory chips 30 that are stacked in a stepwise or cascade structure. The non-volatile memory chips 30 may be, for example, NAND FLASH memory chips.

Each of the non-volatile memory chips 30 may include the input/output pads 31 which are used to input or output signals. The non-volatile memory chips 30 may be stacked using an adhesive layer, and each of the non-volatile memory chips 30 may be stacked to expose the input/output pads 31 that are formed in an underlying non-volatile memory chip. Furthermore, a stacking direction of the non-volatile memory chips 30 may be changed at least one time. For example, each of the first and second chip stacks ST1 and ST2 may include a lower stack 30a and an upper stack 30b, which are sequentially stacked and form stepwise structures inclined in opposite directions. The input/output pads 31 of the non-volatile memory chips 30 may be electrically connected to each other via the metal wires W.

The passive device 40 may be one of a resistor, a capacitor, an inductor, a thermistor, an oscillator, a ferrite bead, an antenna, a varistor, and a crystal. However, the inventive concept is not limited thereto, and any other passive device may be used as the passive device 40. The passive devices 40 may be coupled to the bonding pads 211 of the package substrate 210, and may be electrically connected to the controller chip 20 and the buffer memory chip 10 of the integrated circuit substrate 100 via the internal wires IC, the connection substrate 110, and the lower redistribution layer 120.

The upper mold layer 230 may be provided on the top surface of the package substrate 210 to cover the first and second chip stacks ST1 and ST2 and the passive devices 40. The upper mold layer 230 may be formed of or include an epoxy molding compound.

In some example embodiments, the upper package 200 may be electrically connected to the integrated circuit substrate 100 via the connection terminal 250 (e.g., solder balls and solder bumps). For example, the connection terminals 250 may be attached to the coupling pads 213 of the package substrate 210 on one side and to the upper pad 117b of the integrated circuit substrate 100 on the other side as shown in FIG. 2. The upper package 200 may be mounted on the integrated circuit substrate 100 via the connection terminal 250, and a gap G may be formed between the bottom surface of the upper package 200 and the top surface of the integrated circuit substrate 100 as shown in FIGS. 2-6.

In some example embodiments, the upper package 200 may be electrically connected to the buffer memory chip 10 and the controller chip 20 via the connection terminal 250, the connection substrate 110, and the lower redistribution layer 120. For example, the non-volatile memory chips 30 in the upper package 200 may be controlled by the controller chip 20 of the integrated circuit substrate 100 and may be used to temporarily store or read data in or from the buffer memory chip 10 of the integrated circuit substrate 100. Furthermore, the passive devices 40 may be electrically connected to the buffer memory chip 10 and the controller chip 20 via the connection terminal 250, the connection substrate 110, and the lower redistribution layer 120.

A solid state drive (SSD) package according to some example embodiments of the inventive concept will be described with reference to FIGS. 3 to 6. In the following description of FIGS. 3 to 6, elements described with reference to FIG. 2 may be identified by a similar or identical reference number without repeating an overlapping description thereof, for the sake of brevity.

Referring to FIGS. 3 and 4, the passive devices 40 may be embedded in the connection substrate 110. For example, the passive devices 40 may be electrically connected to the interconnection patterns 113, the conductive vias 115, and the lower and upper pads 117a and 117b, which are provided in the connection substrate 110. In the connection substrate 110, positions of the passive devices 40 may be variously changed. For example, as shown in FIG. 4, the passive devices 40 may be provided between the buffer memory chip 10 and the controller chip 20. In an example, the passive devices 40 may be directly connected to the lower redistribution layer 120.

Figure 5:
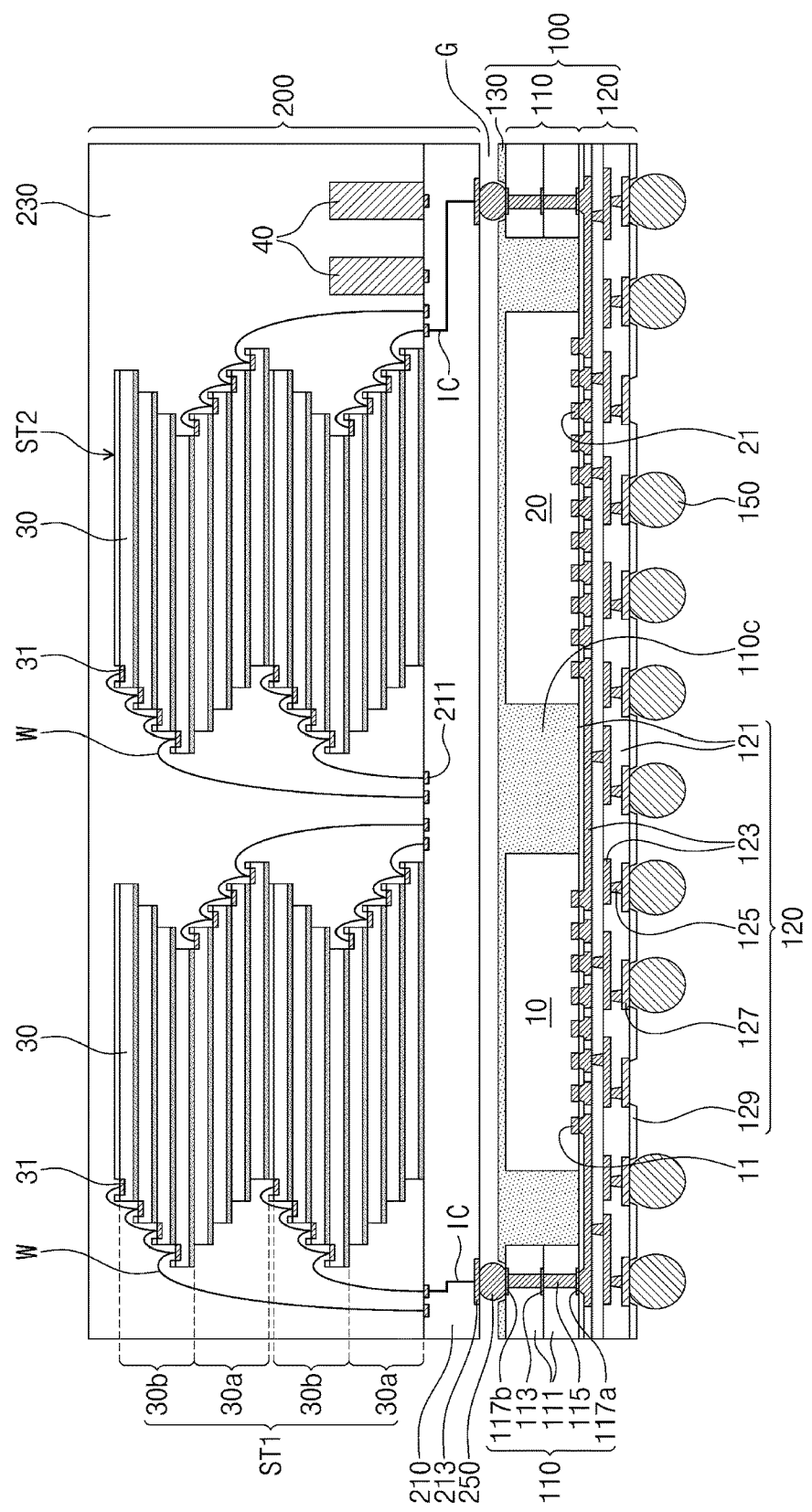

Referring to FIG. 5, the number of the non-volatile memory chips 30 provided in the upper package 200 may be increased to increase a memory capacity of the SSD package 1000. In this case, each of the first and second chip stacks ST1 and ST2 of the upper package 200 may include a plurality of lower stacks 30a and a plurality of upper stacks 30b, which are alternatingly stacked and form stepwise structures inclined in opposite directions. Each of the plurality of lower stacks 30a and the plurality of upper stacks 30b may be coupled to the bonding pads 211, which are provided on the package substrate 210, via the metal wires W.

Figure 6:
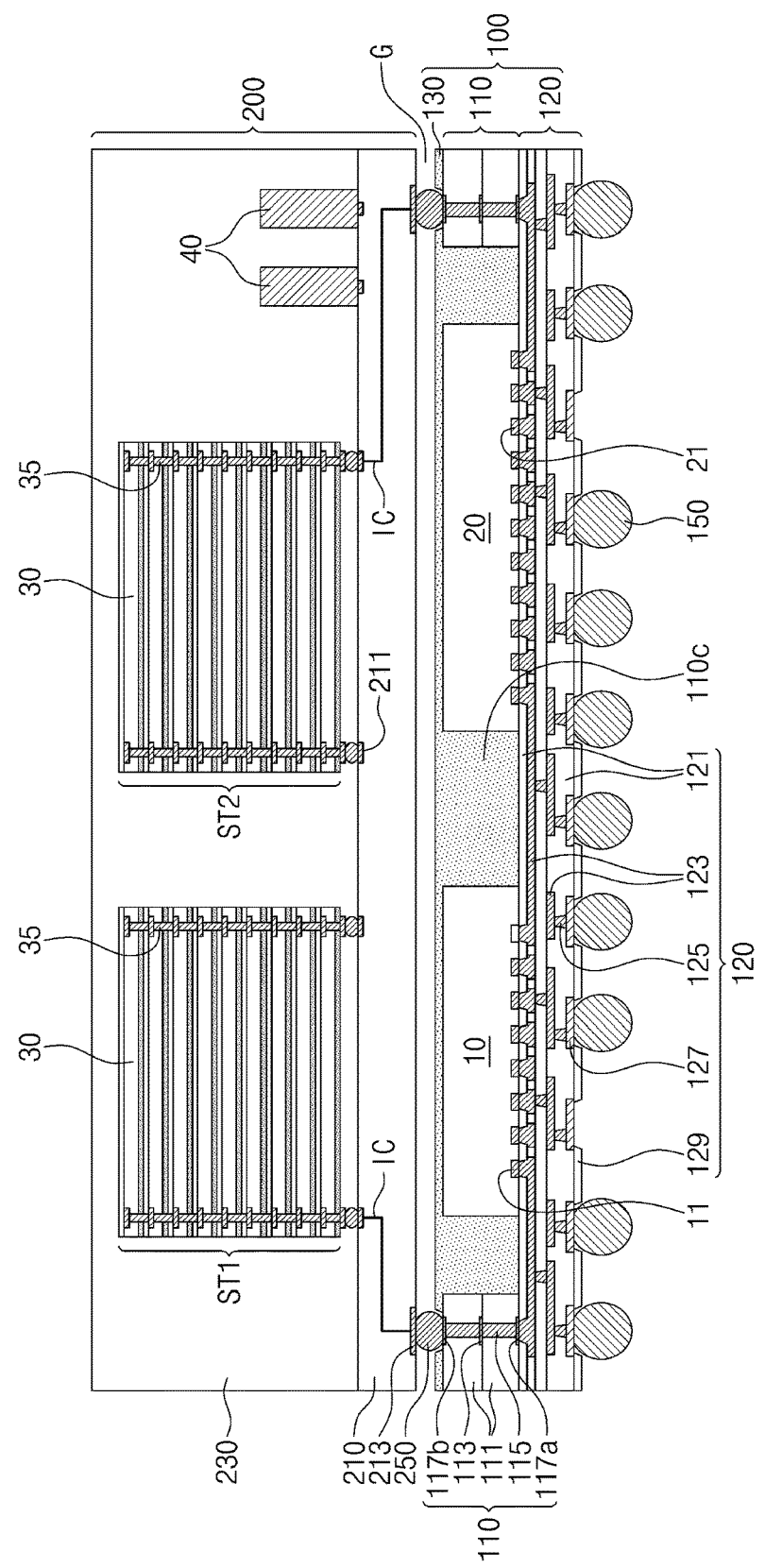

Referring to FIG. 6, each of the first and second chip stacks ST1 and ST2 of the upper package 200 may include a plurality of the non-volatile memory chips 30 that are electrically connected to each other via through vias 35. For example, the non-volatile memory chips 30 may be stacked on the package substrate 210 and may have sidewalls that are vertically aligned, and each of the non-volatile memory chips 30 may include the through vias 35 that are coupled to input/output pads. The first and second chip stacks ST1 and ST2 may be mounted on the package substrate 210 in a flip-chip mounting manner.

A solid state drive package according to an example embodiments of the inventive concept will be described with reference to FIG. 7. In the following description of FIG. 7, an element described with reference to FIG. 2 may be identified by a similar or identical reference number without repeating an overlapping description thereof, for the sake of brevity.

Figure 7:
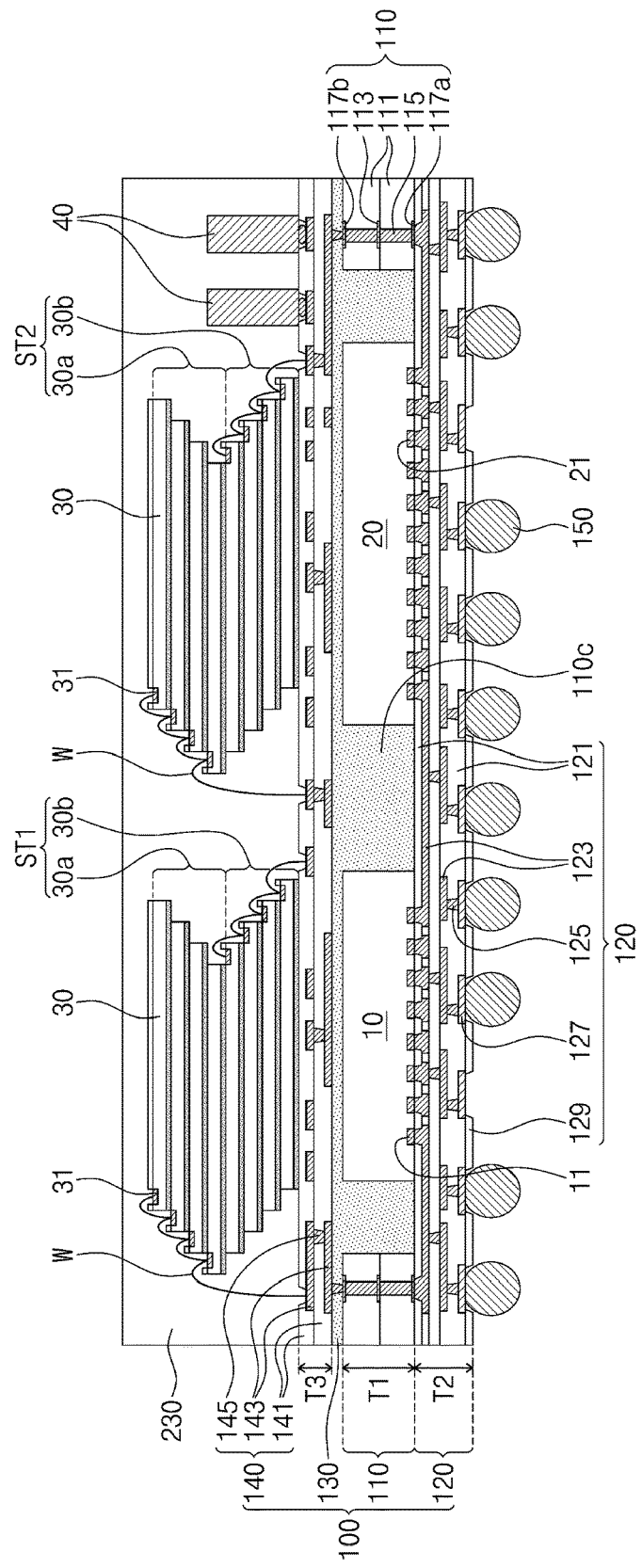

Referring to FIGS. 7 and 13, the SSD package 1000 may include the integrated circuit substrate 100 and the plurality of non-volatile memory chips 30 mounted on the integrated circuit substrate 100.

In some example embodiments, the integrated circuit substrate 100 may include the connection substrate 110, the buffer memory chip 10, the controller chip 20, the lower redistribution layer 120, an upper redistribution layer 140, and the lower mold layer 130.

The upper redistribution layer 140 may be provided on the lower mold layer 130 to cover top surfaces of the buffer memory chip 10, the controller chip 20, and the connection substrate 110. The upper redistribution layer 140 may be electrically connected to the buffer memory chip 10, the controller chip 20, and the connection substrate 110.

In some example embodiments, the upper redistribution layer 140 may have a third thickness T3 that is smaller than the first thickness T1 of the connection substrate 110. Furthermore, the third thickness T3 of the upper redistribution layer 140 may be smaller than a thickness of the buffer memory chip 10 or the controller chip 20.

For example, the upper redistribution layer 140 may include a plurality of upper insulating layers 141, upper redistribution patterns 143, and upper redistribution vias 145.

The upper insulating layers 141 may be provided to cover the lower mold layer 130, and the upper redistribution patterns 143 may be provided between the upper insulating layers 141 and between the upper insulating layer 141 and the lower mold layer 130. The upper redistribution vias 145 may be used to electrically connect the upper redistribution patterns 143, which are positioned at different levels, to each other. The uppermost one of the upper insulating layers 141 may be provided to expose some of the upper redistribution patterns 143, and the upper redistribution patterns 143 exposed by the upper insulating layer 141 may be used as input/output pads.

In some example embodiments, the plurality of non-volatile memory chips 30 may be directly mounted on the upper redistribution layer 140. Furthermore, the passive devices 40 may be directly mounted on the upper redistribution layer 140.

For example, the first and second chip stacks ST1 and ST2 and the passive devices 40 may be provided on the uppermost one of the upper insulating layers 141. In the first and second chip stacks ST1 and ST2, the non-volatile memory chips 30 may be stacked on the upper redistribution layer 140 using an adhesive layer.

Each of the non-volatile memory chips 30 may include the input/output pads 31, and the input/output pads 31 of the non-volatile memory chips 30 may be electrically connected to the upper redistribution patterns 143 of the upper redistribution layer 140 via the metal wires W. In other words, the non-volatile memory chips 30 may be electrically connected to the buffer memory chip 10 and/or to the controller chip 20 via the upper redistribution layer 140, the connection substrate 110, and the lower redistribution layer 120.

The passive devices 40 may be connected to the upper redistribution patterns 143 of the upper redistribution layer 140 via conductive bumps. In other words, the passive devices 40 may be electrically connected to the buffer memory chip 10 and/or the controller chip 20 via the upper redistribution layer 140, the connection substrate 110, and the lower redistribution layer 120.

The upper mold layer 230 may be provided on the upper redistribution layer 140 to cover the first and second chip stacks ST1 and ST2 and the passive devices 40. The upper mold layer 230 may be formed of or include an epoxy molding compound and may be in direct contact with the upper insulating layer 141 of the upper redistribution layer 140.

In some example embodiments, the non-volatile memory chips 30 may be directly mounted on the upper redistribution layer 140 and may be encapsulated by the upper mold layer 230, and thus, a gap may not be formed between the upper mold layer 230 and the upper redistribution layer 140. Accordingly, it may be possible to reduce a thickness of the SSD package 1000.

In the following description of FIGS. 8 to 12, an element described with reference to FIG. 7 may be identified by a similar or identical reference number without repeating an overlapping description thereof, for the sake of brevity.

Figure 8:
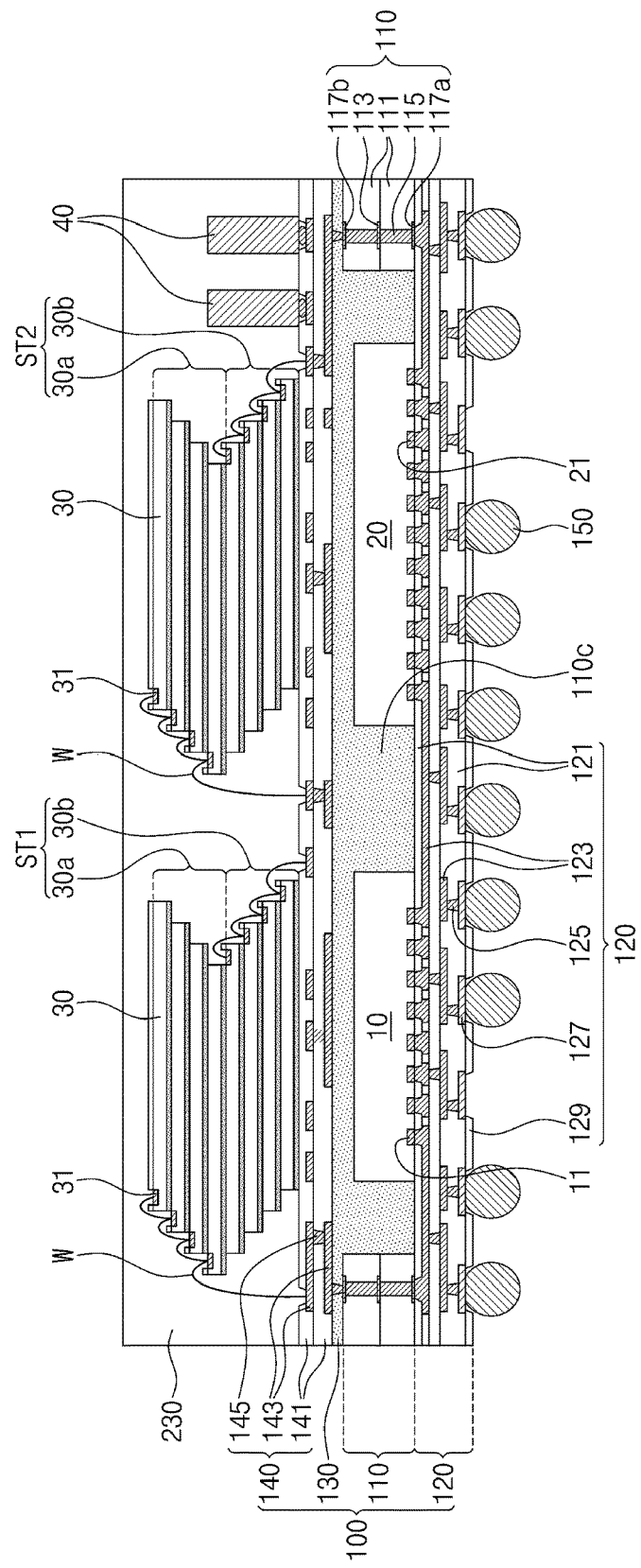

According to an example embodiment shown in FIG. 8, the SSD package 1000 may include the integrated circuit substrate 110 and the plurality of non-volatile memory chips 30 thereon. The integrated circuit substrate 100 may include the connection substrate 110, the buffer memory chip 10, the controller chip 20, the lower redistribution layer 120, the lower mold layer 130, and the upper redistribution layer 140, and each of the buffer memory chip 10 and the controller chip 20 may have a thickness that is smaller than that of the connection substrate 110. In other words, the buffer memory chip 10 and the controller chip 20 may have top surfaces that are lower than that of the connection substrate 110.

Figure 9:
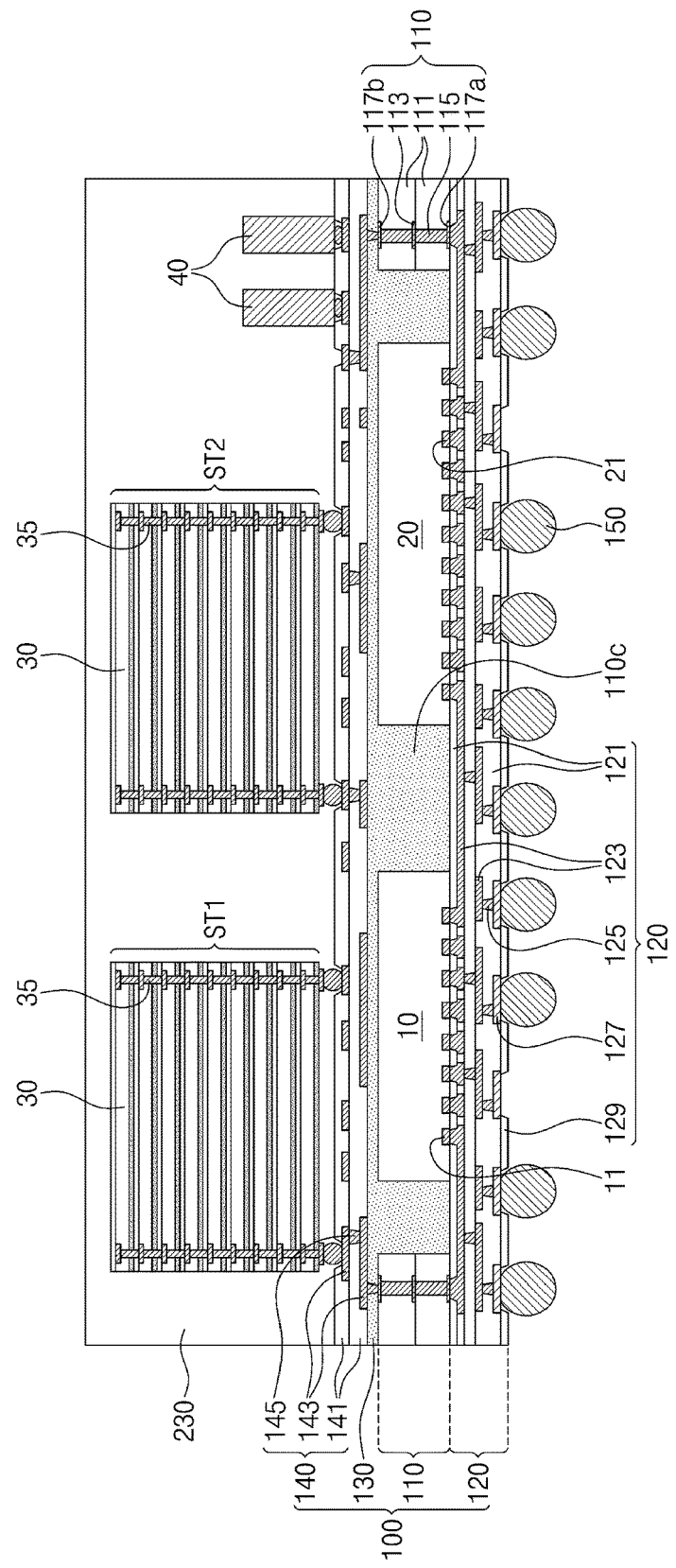

According to an example embodiment shown in FIG. 9, the first and second chip stacks ST1 and ST2 may be provided on the upper redistribution layer 140 of the integrated circuit substrate 100, and each of the first and second chip stacks ST1 and ST2 may include the plurality of non-volatile memory chips 30 that are electrically connected to each other through the through vias 35. The first and second chip stacks ST1 and ST2 may be mounted on the upper redistribution patterns 143 of the upper redistribution layer 140 in a flip-chip bonding manner.

Figure 10:
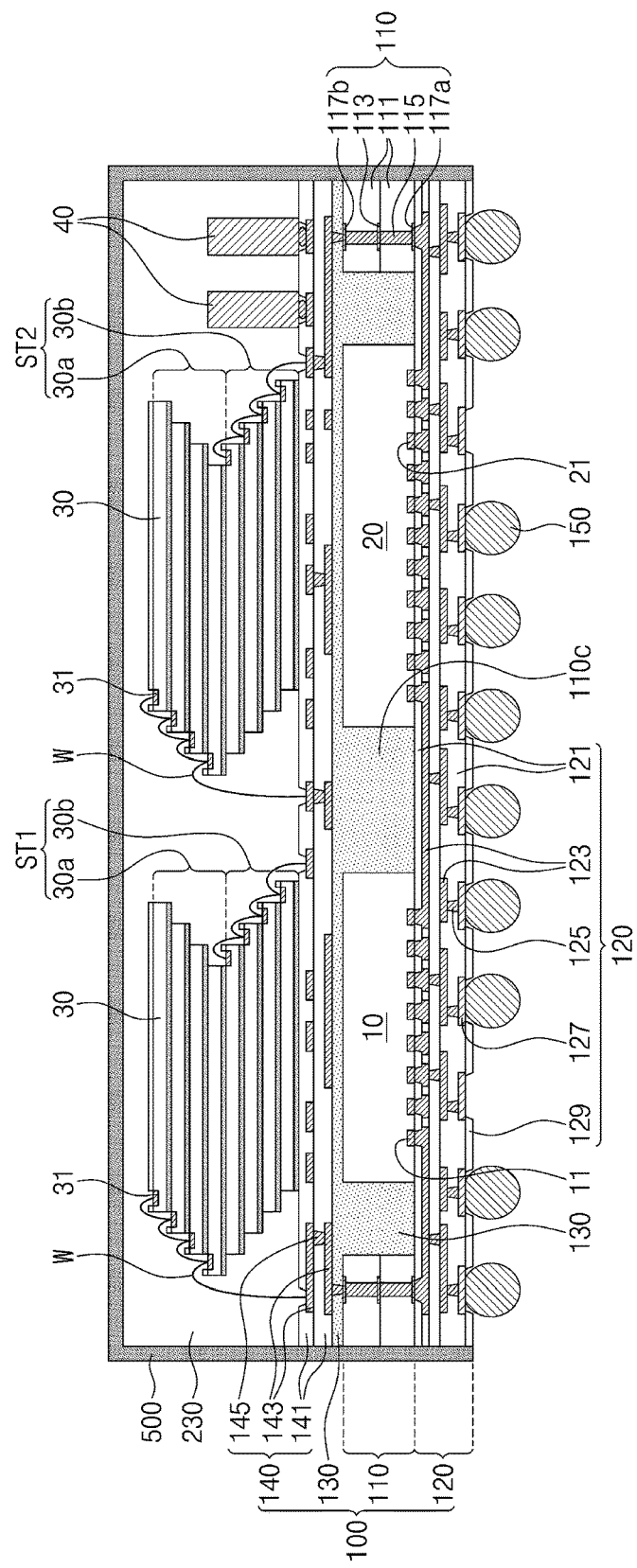

According to an example embodiment shown in FIG. 10, the SSD package 1000 may include the integrated circuit substrate 100, the plurality of non-volatile memory chips 30 on the integrated circuit substrate 100, and a shielding layer 500.

The shielding layer 500 may prevent an external electronic component from suffering from an electromagnetic interference (EMI) issue which may be caused by an electromagnetic wave produced in the SSD package 1000. The shielding layer 500 may be formed of or include a metallic epoxy material, in which a metal and an epoxy resin are contained. The shielding layer 500 may be formed of or include a metal material (e.g., copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), or platinum (Pt)).

In some example embodiments, because there is no gap between the integrated circuit substrate 100 and the upper mold layer 230, the shielding layer 500 may continuously extend from side surfaces of the integrated circuit substrate 100 to side surfaces of the upper mold layer 230. For example, the shielding layer 500 may be provided to be in direct contact with top and side surfaces of the upper mold layer 230 and side surfaces of the integrated circuit substrate 100.

The shielding layer 500 may be in contact with a ground pad (not shown), which is provided in the lower and upper redistribution layers 120 and 140 of the integrated circuit substrate 100. Accordingly, a ground voltage may be applied to the shielding layer 500.

In some example embodiments, the shielding layer 500 may be formed by coating the metallic epoxy material onto the side surfaces of the upper mold layer 230 and the integrated circuit substrate 100 using a spray device. Accordingly, the shielding layer 500 may be formed to have a substantially uniform thickness on the top and side surfaces of the upper mold layer 230 and the side surfaces of the integrated circuit substrate 110. In certain example embodiments, the shielding layer 500 may be formed by a film deposition method, such as an electroplating method, an electro-less plating method, a sputtering method. In certain example embodiments, the shielding layer 500 may be formed by a screen printing method.

Figure 11:
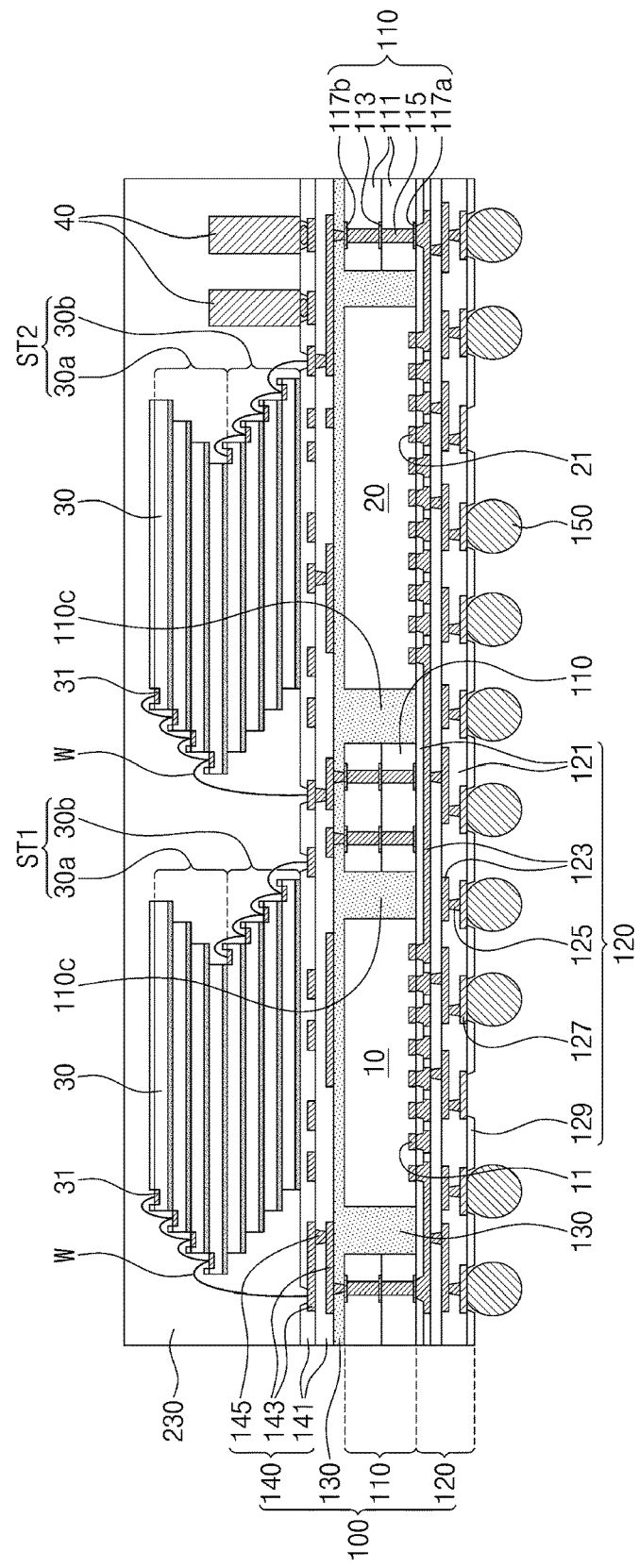

According to an example embodiment shown in FIG. 11, the connection substrate 110 of the integrated circuit substrate 100 may have a plurality of cavities 110c, and the buffer memory chip 10 and the controller chip 20 may be provided in each of the cavities 110c. For example, the connection substrate 110 may include at least one portion positioned between the buffer memory chip 10 and the controller chip 20.

Figure 12:
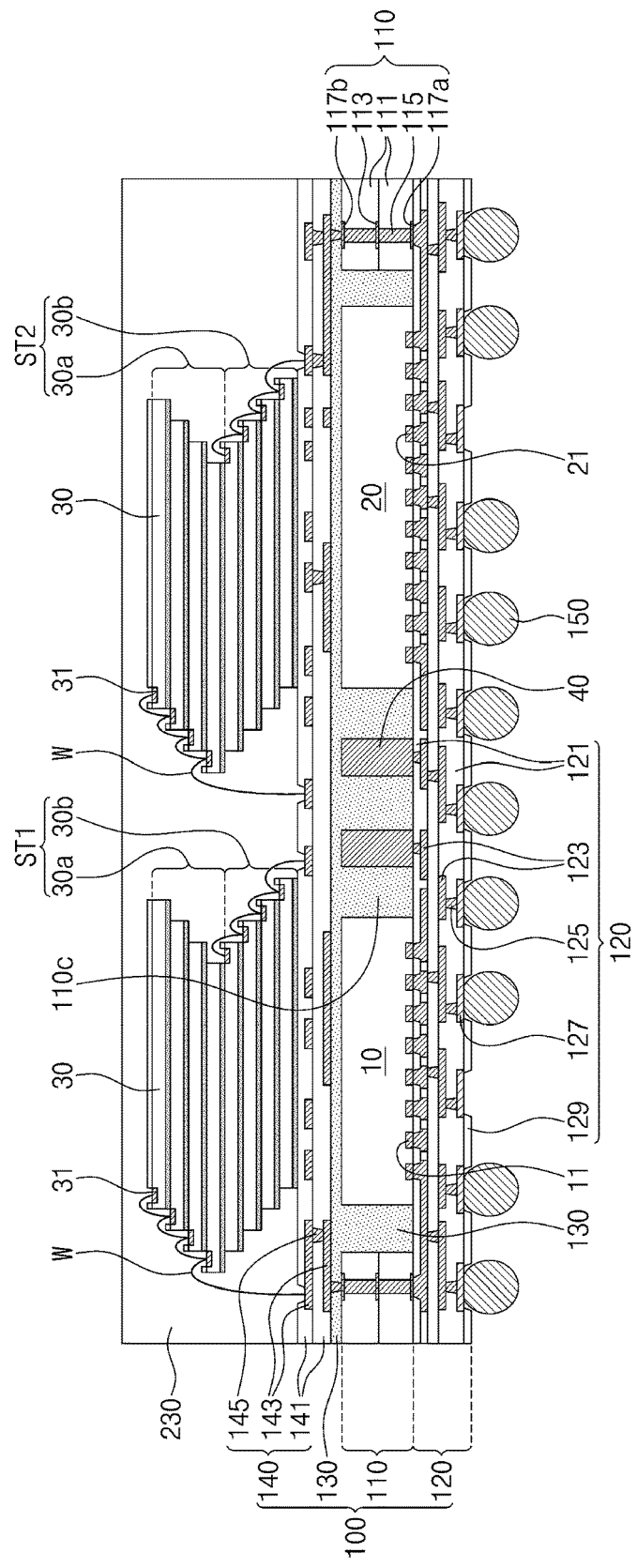
Figure 13:
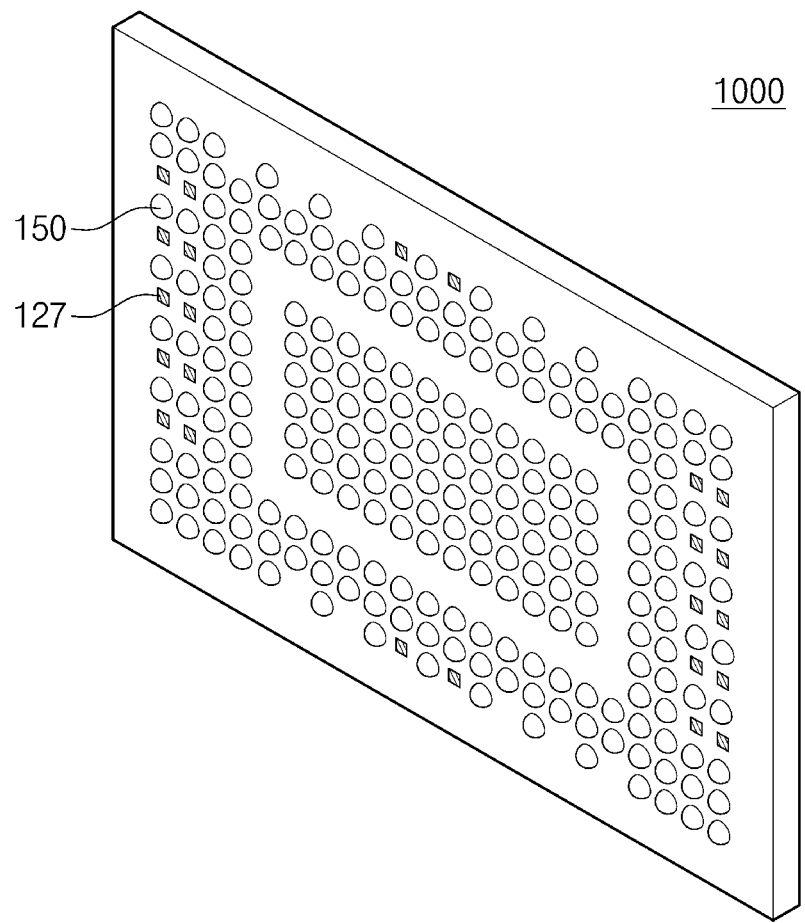
FIG. 13 is a perspective view of a solid state drive package according to an example embodiment of the inventive concept.

According to an example embodiment shown in FIG. 12, the integrated circuit substrate 100 may include the connection substrate 110, the buffer memory chip 10, the controller chip 20, the passive devices 40, the lower redistribution layer 120, the upper redistribution layer 140, and the lower mold layer 130.

In an example, the passive devices 40 may be disposed between the buffer memory chip 10 and the controller chip 20 and may be electrically connected to the buffer memory chip 10 and/or the controller chip 20 through the lower redistribution layer 120.

According to some example embodiments of the inventive concept, a solid state drive (SSD) package may be fabricated in the form of a single package and may be used to replace a hard disk drive of a personal computer or a notebook. Furthermore, the SSD package may be provided as a part of a portable electronic device (e.g., a smart phone, a tablet personal computer, a digital camera, an MP3 player, or a personal digital assistant). The SSD package may occupy a small space in an electronic device, and thus, it may be possible to increase a memory capacity of the electronic device.

Hereinafter, a method of fabricating a solid state drive package according to example embodiments of the inventive concept will be described with reference to FIGS. 14A, 14B and 15 to 21.

FIGS. 14A, 14B and 15 to 21 are sectional views illustrating a method of fabricating a solid state drive (SSD) package according to example embodiments of the inventive concept.

Figure 14A:
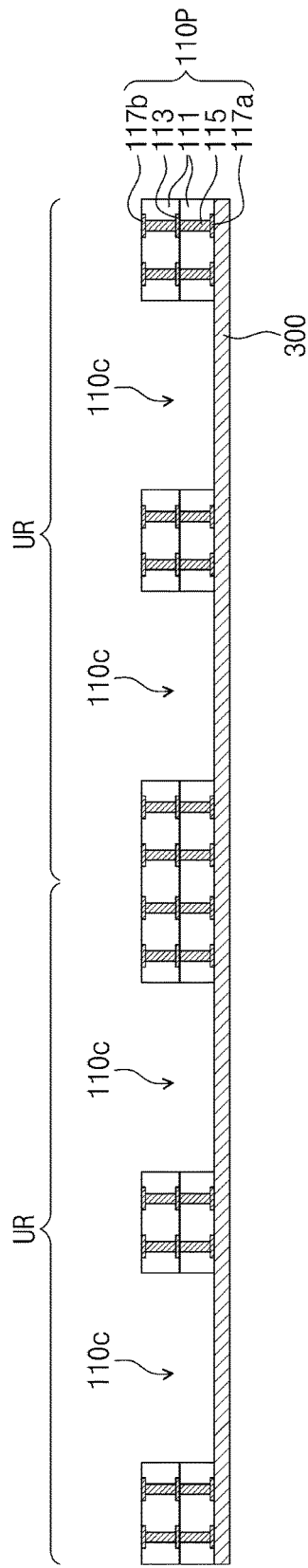
FIGS. 14A and 14B and FIGS. 15 to 21 are sectional views illustrating a method of fabricating a solid state drive package according to example embodiments of the inventive concept.
Figure 14B:
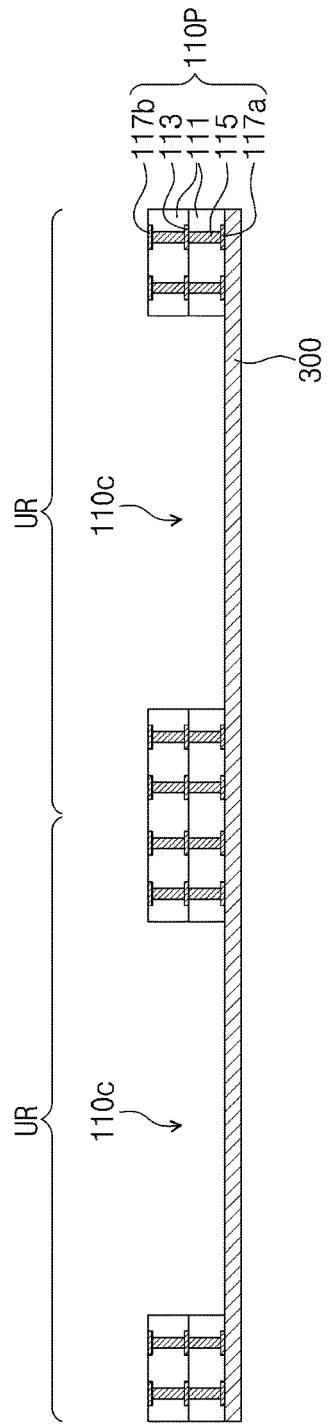

Referring to FIGS. 14A and 14B, a connection substrate panel 110P with a plurality of unit regions UR may be prepared. The connection substrate panel 110P may be provided to have at least one cavity 110c on each of the unit regions UR. In some example embodiments, the connection substrate panel 110P may be provided to have two cavities 110c on each of the unit regions UR, as shown in FIG. 14A. In certain example embodiments, the connection substrate panel 110P may be provided to have a single cavity 110c on each of the unit regions UR, as shown in FIG. 14B.

In an example, the connection substrate panel 110P may be a printed circuit board panel with circuit patterns. However, the example embodiments of the inventive concepts are not limited thereto. The connection substrate panel 110P may include the plurality of insulating layers 111, the interconnection patterns 113 between the insulating layers 111, and the conductive vias 115 connecting the interconnection patterns 113 but may be configured to have a coreless structure. The connection substrate panel 110P may include the lower and upper pads 117a and 117b that are provided on bottom and top surfaces thereof.

The connection substrate panel 110P with the cavities 110c may be attached to a support substrate 300. The support substrate 300 may include an adhesive layer and may be formed of an adhesive material whose adhesive strength can be changed by UV light or heat.

Figure 15:
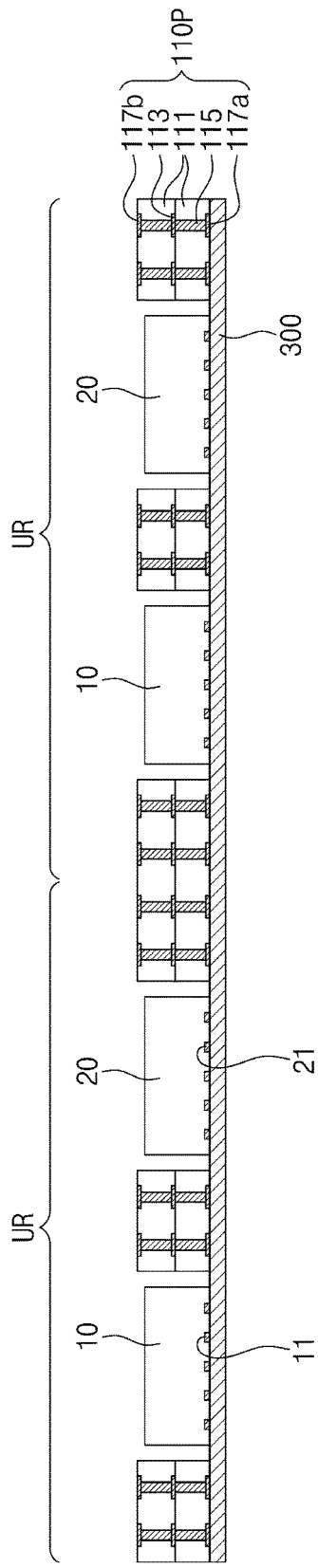

Referring to FIG. 15, the buffer memory chip 10 and the controller chip 20 may be attached to the support substrate 300. Each of the buffer memory chip 10 and the controller chip 20 may be provided in a corresponding one of the cavities 110c of the connection substrate panel 110P. In the case where the cavity 110c is solely formed in each of the unit regions UR, the buffer memory chip 10 and the controller chip 20 may be provided in one of the cavities 110c. The buffer memory chip 10 and the controller chip 20 may have the chip pads 11 and 21, which are provided on bottom surfaces thereof, and may be attached to the support substrate 300. The chip pads 11 and 21 of the buffer memory chip 10 and the controller chip 20 may be faced with the support substrate 300.

In some example embodiments, the buffer memory chip 10 and the controller chip 20 may have respective top surfaces that are positioned at a level higher or lower than that of the connection substrate panel 110P.

Figure 16:
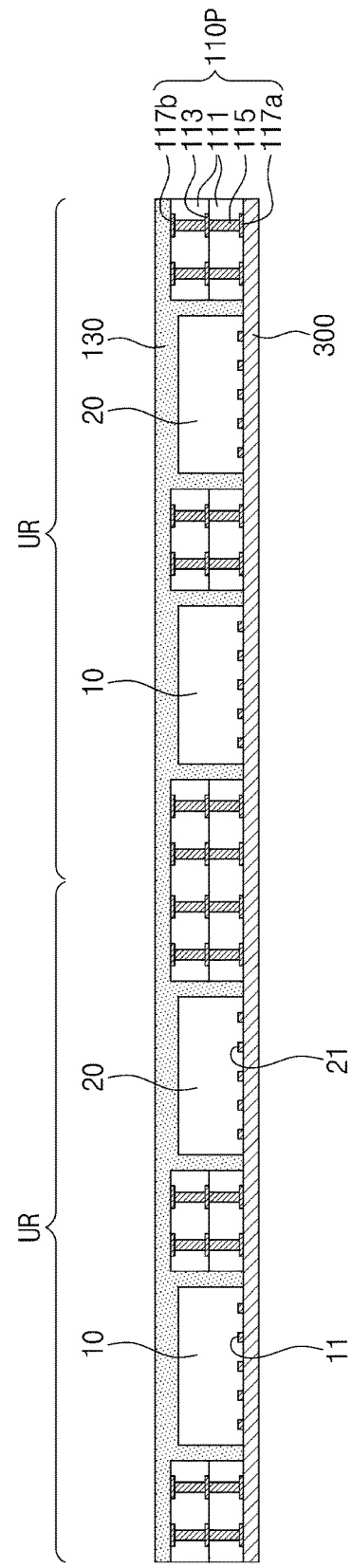

Referring to FIG. 16, the lower mold layer 130 may be formed on the support substrate 300. The lower mold layer 130 may be formed to cover the top surfaces of the connection substrate panel 110P, the buffer memory chip 10, and the controller chip 20. The lower mold layer 130 may fill the cavity 110c, in which the buffer memory chip 10 and the controller chip 20 are provided. The lower mold layer 130 may be formed of or include an insulating polymer (e.g., an epoxy-based polymer).

The support substrate 300 may be removed, after the formation of the lower mold layer 130. For example, the support substrate 300 may be heated to remove an adhesive property of an adhesive layer, and thus, the support substrate 300 may be detached from the connection substrate panel 110P, the buffer memory chip 10, and the controller chip 20.

Figure 17:
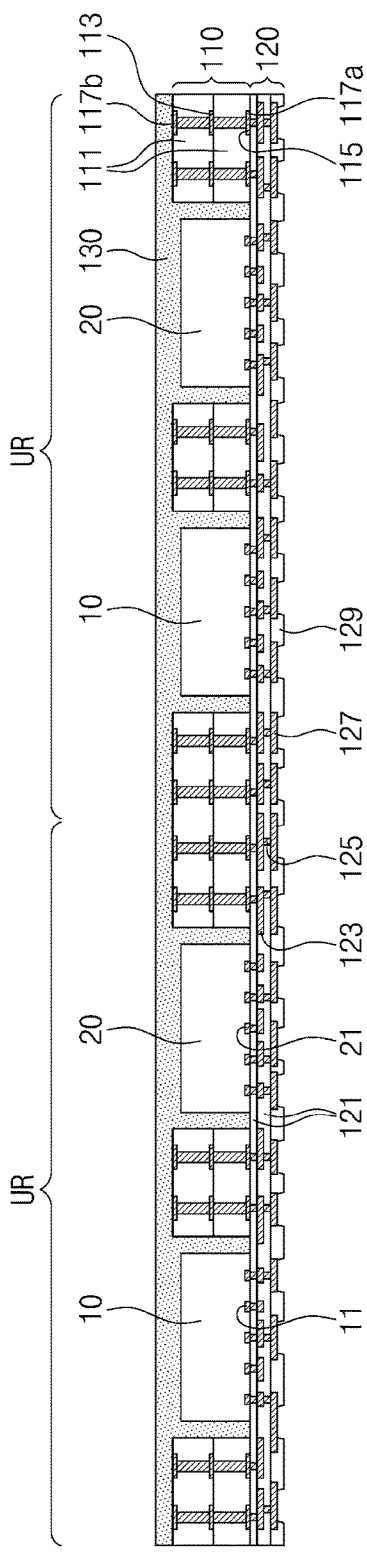

Referring to FIG. 17, the lower redistribution layer 120 may be formed on bottom surfaces of the connection substrate panel 110P, the buffer memory chip 10, and the controller chip 20, after the removal of the support substrate 300.

In some example embodiments, the formation of the lower redistribution layer 120 may include forming the first lower insulating layer 121 having via holes exposing the connection substrate panel 110P and the buffer memory chip 10 and the controller chip 20, forming the lower redistribution patterns and vias 123 and 125 on the first lower insulating layer 121, forming the second lower insulating layer 121 to cover the lower redistribution patterns 123, forming the outer connection pads 127 on the second lower insulating layer 121, and forming the lower protection layer 129 on the second lower insulating layer 121 to expose the outer connection pads 127.

As an example, the first lower insulating layer 121 may cover bottom surfaces of the connection substrate panel 110P, the buffer memory chip 10, and the controller chip 20. The first lower insulating layer 121 may be patterned to form the via holes exposing the chip pads 11 and 21 and the lower pads 117a.

After the formation of the via holes, a metal seed layer (not shown) may be formed on a surface of the first lower insulating layer 121. The metal seed layer may be formed by a film deposition method, such as an electroplating method, an electro-less plating method, a sputtering method. The metal seed layer may be formed of or include at least one of chromium (Cr), titanium (Ti), copper (Cu), copper (Cu), nickel (Ni), tin (Sn), or alloys thereof.

Thereafter, a photoresist pattern (not shown) may be formed on the metal seed layer, and then, a metal pattern may be formed on the metal seed layer, which is exposed by the photoresist pattern, using a plating method. Next, the photoresist pattern may be removed, and then, the lower redistribution patterns and vias 123 and 125 may be formed by selectively etching the metal seed layer using the metal pattern as an etch mask.

The second lower insulating layer 121 and the outer connection pads 127 may be formed on the first lower insulating layer 121 to cover the lower redistribution patterns 123. The outer connection pads 127 may be formed by substantially the same method as that for forming the lower redistribution patterns and vias 123 and 125. The outer connection pads 127 may be coupled to the lower redistribution patterns 123 through vias.

In the case where the lower protection layer 129 is formed of a polyimide-based material (e.g., photo sensitive polyimide (PSPI)), the lower protection layer 129 may be formed by a spin coating process and may be patterned by an exposure process, not by an additional process of forming a photoresist layer. The exposure process may be performed to form openings exposing the outer connection pads 127.

Furthermore, after the formation of the lower protection layer 129, an adhesive conductive pattern (not shown) may be formed on the outer connection pads 127 that are exposed through the openings of the lower protection layer 129. The adhesive conductive pattern may be an under-bump metallurgy (UBM) serving as an adhesive layer, a diffusion prevention layer, and a wetting layer. The adhesive conductive pattern may include at least one of metals (e.g., chromium (Cr), titanium (Ti), copper (Cu), nickel (Ni), titanium-tungsten (TiW), or nickel-vanadium (NiV)) and may be formed to have a multi-layered structure. As an example, the adhesive conductive pattern may be formed to have one of Ti/Cu, Cr/Cr—Cu/Cu, TiW/Cu, Al/NiV/Cu, and Ti/Cu/Ni structures.

Figure 18:
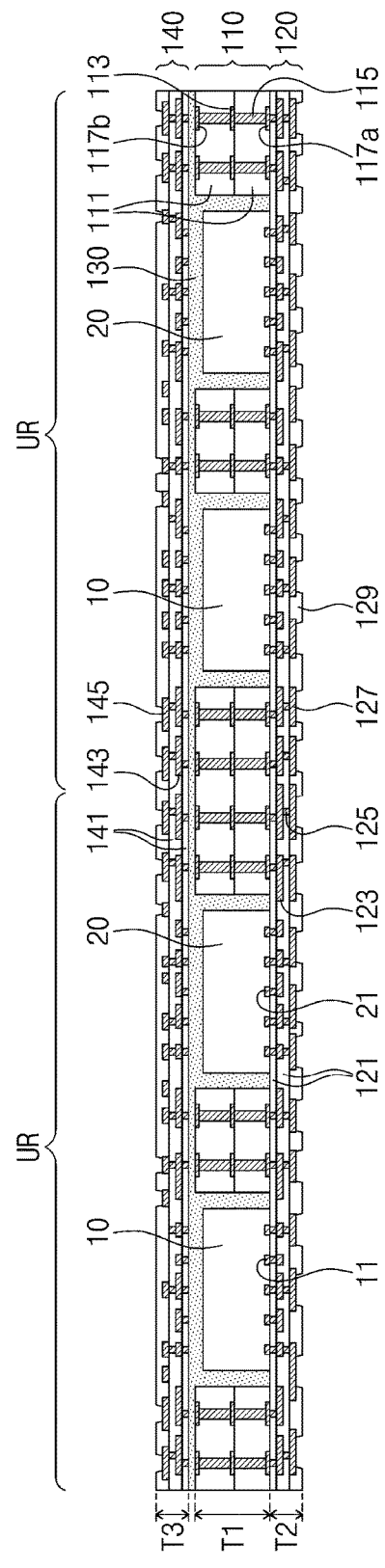

Referring to FIG. 18, the upper redistribution layer 140 may be formed on the top surfaces of the connection substrate panel 110P, the buffer memory chip 10, and the controller chip 20.

In some example embodiments, the formation of the upper redistribution layer 140 may include forming the upper insulating layer 141 on the lower mold layer 130, forming a via hole to penetrating the upper insulating layer 141 and the lower mold layer 130, and forming upper redistribution patterns and vias 143 and 145 on the upper insulating layer 141 with the via hole.

In detail, the upper insulating layer 141 may be formed to cover the lower mold layer 130. The upper insulating layer 141 may be formed of an insulating material different from the lower mold layer 130. For example, the upper insulating layer 141 may be formed of a silicon oxide layer, a silicon nitride layer, or a silicon oxynitride layer.

The via holes may be formed by selectively removing the upper insulating layer 141 and the lower mold layer 130 using a laser drilling process.

The upper redistribution patterns and vias 143 and 145 may be formed by a film deposition method, such as an electroplating method, an electro-less plating method, a sputtering method, and may include a seed layer and a metal pattern, similar to the lower redistribution patterns and vias 123 and 125. The upper insulating layer 141 may be formed to expose portions of the uppermost ones of the upper redistribution patterns 143 of the upper redistribution layer 140.

In certain example embodiments, a process of forming the upper redistribution layer 140 may be omitted.

Figure 19:
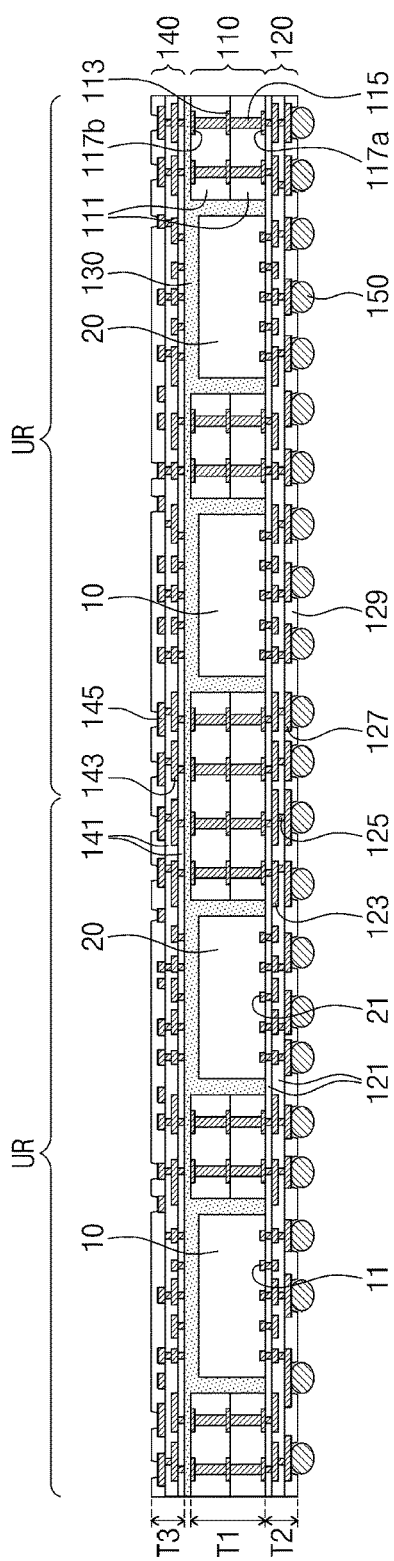

Referring to FIG. 19, the outer connection terminals 150 may be attached to the outer connection pads 127 of the lower redistribution layer 120. The outer connection terminals 150 may be solder balls or bumps. The outer connection terminals 150 may be electrically connected to the connection substrate panel 110P, the buffer memory chip 10, and the controller chip 20 via the lower redistribution layer 120.

In some example embodiments, the outer connection terminals 150 may be a ball grid array (BGA) and may not be attached to some of the outer connection pads 127, as shown in FIG. 13.

Figure 20:
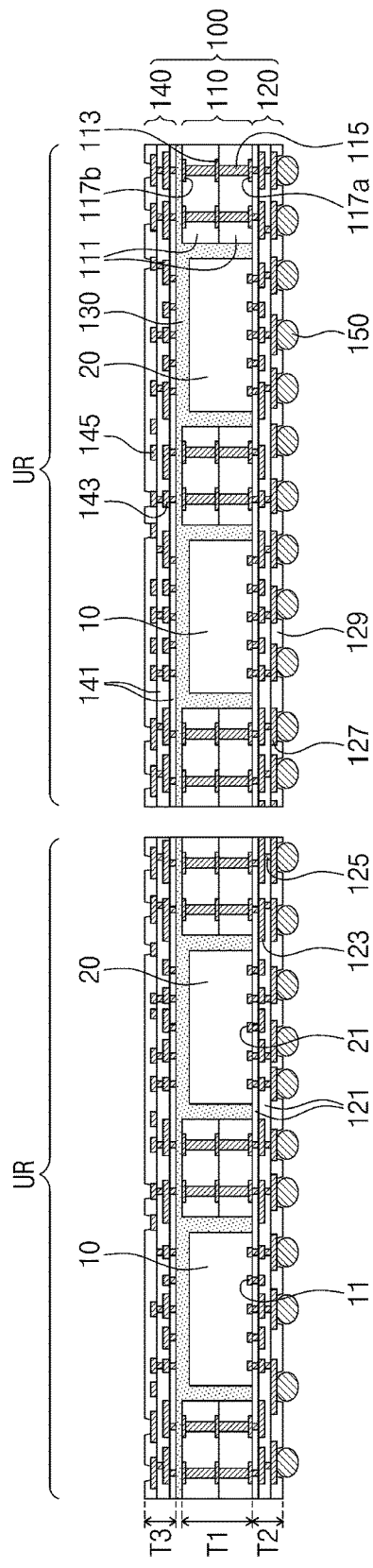

Referring to FIG. 20, a sawing process may be performed on the connection substrate panel 110P, and thus, the connection substrate panel 110P may be separated into a plurality of the unit regions UR, each of which includes the buffer memory chip 10 and the controller chip 20.

For example, a laser or a sawing blade may be used to cut the lower and upper redistribution layers 120 and 140, the lower mold layer 130, and the connection substrate panel 110P between the unit regions UR. As a result, the connection substrate panel 110P may be divided into a plurality of integrated circuit substrates 100 that are separated from each other. Each of the integrated circuit substrates 100 may include the connection substrate 110, the lower and upper redistribution layers 120 and 140, the buffer memory chip 10, and the controller chip 20, as described above.

Figure 21:
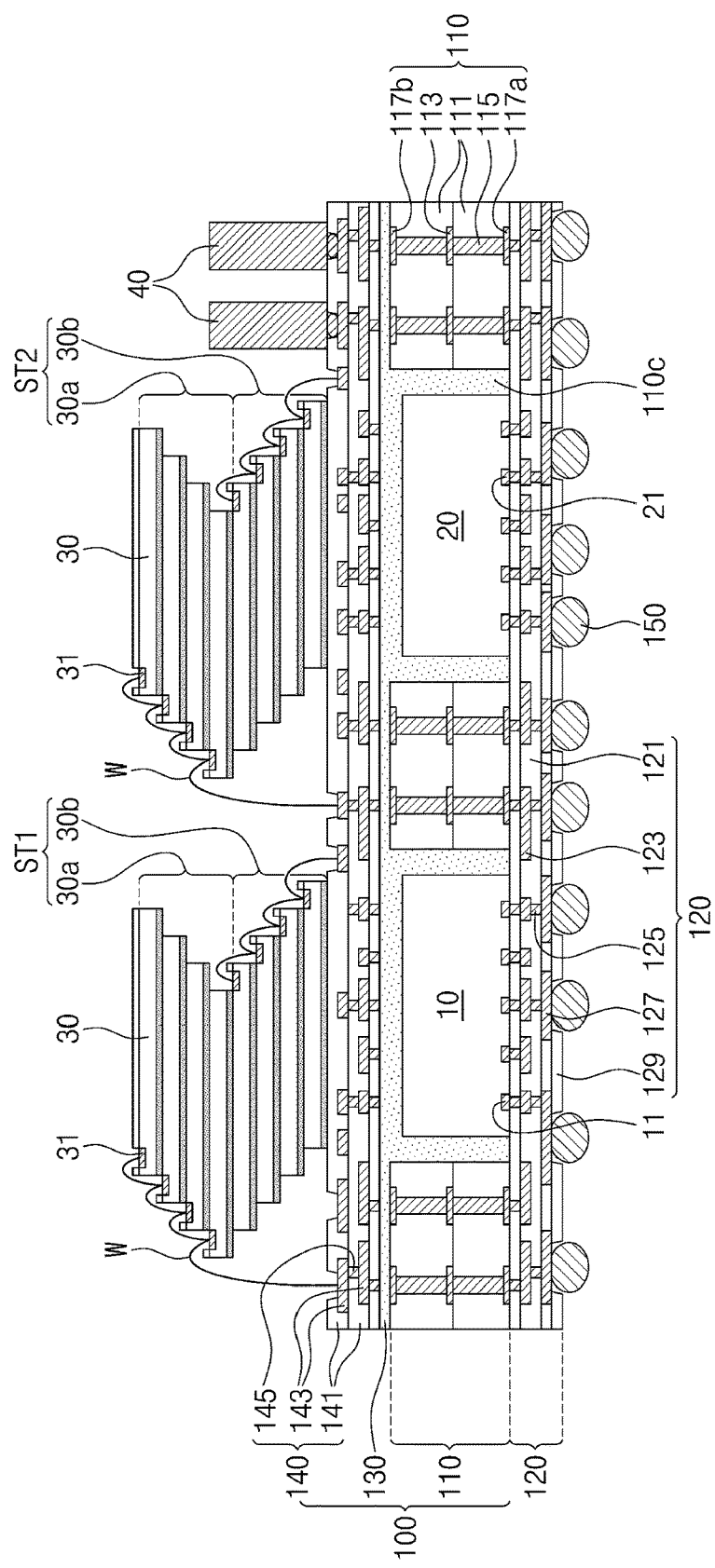

Referring to FIG. 21, the non-volatile memory chips 30 and the passive devices 40 may be mounted on each of the integrated circuit substrates 100.

For example, the plurality of non-volatile memory chips 30 may be stacked on the upper redistribution layer 140 of the integrated circuit substrate 100 using an adhesive layer. Here, as described above, the non-volatile memory chips 30 may be stacked in various shapes.

In some example embodiments, after the stacking of the non-volatile memory chips 30, the metal wires W may be bonded to upper redistribution patterns of the upper redistribution layer 140 and to the input/output pads 31 of the non-volatile memory chips 30. In certain example embodiments, the non-volatile memory chips 30 may be mounted on the upper redistribution layer 140 in a flip-chip bonding manner.

The passive devices 40 may be attached to the upper redistribution patterns 143 of the upper redistribution layer 140 using solder bumps. In certain example embodiments, as described above, the passive devices 40 may be provided in the integrated circuit substrate 100 or in the connection substrate 110.

Thereafter, as described above, the upper mold layer 230 may be formed to cover the upper redistribution layer 140.

In certain example embodiments, as shown in FIG. 2, the upper package 200 including the non-volatile memory chips 30 mounted on the package substrate 210 may be mounted on the integrated circuit substrate 100 in a flip-chip bonding manner.

According to some example embodiments of the inventive concept, a solid state drive may consist of a single semiconductor package and thus may be easily mounted to a portable electronic device. Furthermore, a plurality of non-volatile memory chips may be provided on an integrated circuit substrate with a controller chip, and this may make it possible to reduce a thickness of a solid state drive package.

Accordingly, it may be possible to reduce an occupying space of a solid state drive package in a portable electronic device and thereby to reduce a size of a portable electronic device. Furthermore, this may make it possible to increase a size of other electronic component (e.g., battery and so forth) provided in a portable electronic device.

While example embodiments of the inventive concepts have been particularly shown and described, it will be understood by one of ordinary skill in the art that variations in form and detail may be made therein without departing from the spirit and scope of the attached claims.

What is claimed is:

1. A solid state drive (SSD) package, comprising:
an integrated circuit substrate comprising:
a lower redistribution layer;
a volatile memory and a memory controller, the volatile memory and the memory controller being provided on the lower redistribution layer; and
a connection substrate provided on the lower redistribution layer, the connection substrate provided on an outer periphery of the volatile memory and an outer periphery of the memory controller;
a plurality of nonvolatile memory devices provided on the integrated circuit substrate;
an upper mold layer provided on a top surface of the integrated circuit substrate to cover the plurality of nonvolatile memory devices; and
a shielding layer extending from side surfaces of the integrated circuit substrate to side surfaces of the upper mold layer and a top surface of the upper mold layer,
wherein the plurality of nonvolatile memory devices are electrically connected to the volatile memory and the memory controller via the connection substrate and the lower redistribution layer.

2. The SSD package of claim 1, wherein the lower redistribution layer comprises:
at least two lower insulating layers covering a bottom surface of the connection substrate, a bottom surface of the volatile memory, and a bottom surface of the memory controller;
at least one lower redistribution pattern layer provided between the at least two lower insulating layers and coupled to the connection substrate, the volatile memory, and the memory controller; and
outer connection pads connected to the at least one lower redistribution pattern layer.

3. The SSD package of claim 2, wherein the volatile memory is connected to the memory controller via the at least one lower redistribution pattern layer.

4. The SSD package of claim 2, wherein the connection substrate is connected to the volatile memory and the memory controller via the at least one lower redistribution pattern layer.

5. The SSD package of claim 1, wherein a thickness of the lower redistribution layer is smaller than a thickness of the connection substrate.

6. The SSD package of claim 1, further comprising passive devices provided on the integrated circuit substrate, the passive devices being connected to the volatile memory via the connection substrate and the lower redistribution layer.

7. The SSD package of claim 1, further comprising passive devices provided on the lower redistribution layer, the passive devices being connected to the volatile memory via the lower redistribution layer.

8. The SSD package of claim 1, wherein the integrated circuit substrate further comprises an upper redistribution layer provided to cover a top surface of the connection substrate, a top surface of the volatile memory, and a top surface of the memory controller, and
wherein the upper redistribution layer is electrically connected to the connection substrate.

9. The SSD package of claim 8, wherein a thickness of the upper redistribution layer is smaller than a thickness of the connection substrate.

10. The SSD package of claim 8, wherein the plurality of nonvolatile memory devices are electrically connected to the upper redistribution layer via metal wires.

11. The SSD package of claim 8, wherein the upper redistribution layer comprises:
at least two upper insulating layers provided on the top surfaces of the connection substrate, the top surface of the volatile memory, and the top surface of the memory controller; and
at least one upper redistribution pattern layer provided between the at least two upper insulating layers, the at least one upper redistribution pattern layer being coupled to the connection substrate,
wherein the plurality of nonvolatile memory devices are stacked on an uppermost one of the at least two upper insulating layers.

12. The SSD package of claim 1, further comprising:
a package substrate provided between the integrated circuit substrate and the plurality of volatile memory devices; and
connection terminals provided on a bottom surface of the package substrate to connect the package substrate to the connection substrate,
wherein the plurality of nonvolatile memory devices are electrically connected to the package substrate via metal wires.

13. The SSD package of claim 12, further comprising an upper mold layer provided on a top surface of the package substrate to cover the plurality of nonvolatile memory devices.

14. The SSD package of claim 1, wherein the volatile memory comprises a controller chip, the memory controller comprises a second memory chip and the plurality of nonvolatile memory devices comprise a plurality of third memory chips.

15. A solid state drive (SSD) package, comprising:
an integrated circuit substrate comprising:
a lower redistribution layer;
a first chip and a second chip, the first chip and the second chip being provided on the lower redistribution layer; and
a connection substrate provided on the lower redistribution layer, the connection substrate provided on an outer periphery of the first chip and an outer periphery of the second chip;
a plurality of third chips provided on the integrated circuit substrate;
an upper mold layer provided on a top surface of the integrated circuit substrate to cover the plurality of third chips; and
a shielding layer extending from side surfaces of the integrated circuit substrate to side surfaces of the upper mold layer and a top surface of the upper mold layer,
wherein the plurality of third chips are electrically connected to the first chip and the second chip via the connection substrate and the lower redistribution layer.

16. A solid state drive (SSD) package, comprising:
an integrated circuit substrate comprising:
a first redistribution layer;
a first chip and a second chip, the first chip and the second chip being provided on the first redistribution layer; and
a connection substrate provided on the first redistribution layer, the connection substrate provided on an outer periphery of the first chip and the second chip;
an upper package provided on the integrated circuit substrate and comprising:
a package substrate; and
a plurality of third chips stacked on the package substrate;
a connection layer provided between the integrated circuit substrate and the upper package; and
a shielding layer extending from side surfaces of the integrated circuit substrate to side surfaces of the upper package, side surfaces of the connection layer, and a top surface of the upper package,
wherein the connection layer comprises at least one of a second redistribution layer and a connection terminal layer, and
wherein the plurality of third chips are electrically connected to the first chip via the connection substrate and the first redistribution layer.

17. The SSD package of claim 16, wherein the connection terminal layer comprises a plurality of solder balls or a plurality of solder bumps.

18. The SSD package of claim 16, wherein the second redistribution layer comprises:
at least two second insulating layers provided on a top surface of the connection substrate, a top surface of the first chip, and a top surface of the second chip; and
at least one second redistribution pattern layer provided between the at least two second insulating layers, the at least one second redistribution pattern layer being coupled to the connection substrate,
wherein the plurality of third chips are stacked on an uppermost one of the at least two second insulating layers.

19. The SSD package of claim 16, wherein the first redistribution layer comprises:
at least two first insulating layers covering a bottom surface of the connection substrate, a bottom surface of the first chip, and a bottom surface of the second chip;
at least one lower redistribution pattern layer provided between the at least two first insulating layers and coupled to the connection substrate, the first chip, and the second chip; and
outer connection pads connected to the at least one first redistribution pattern layer.

20. The SSD package of claim 16, wherein the first chip comprises a controller chip, the second chip comprises a second memory chip and the plurality of third chips comprise a plurality of third memory chips.

\* \* \* \* \*